United States Patent
Nazarian et al.

(10) Patent No.: US 8,982,647 B2
(45) Date of Patent: Mar. 17, 2015

(54) RESISTIVE RANDOM ACCESS MEMORY EQUALIZATION AND SENSING

(71) Applicant: Crossbar, Inc., Santa Clara, CA (US)

(72) Inventors: Hagop Nazarian, San Jose, CA (US); Sang Nguyen, Union City, CA (US)

(73) Assignee: Crossbar, Inc., Santa Clara, CA (US)

( * ) Notice: Subject to any disclaimer, the term of this patent is extended or adjusted under 35 U.S.C. 154(b) by 297 days.

(21) Appl. No.: 13/676,943

(22) Filed: Nov. 14, 2012

(65) Prior Publication Data
US 2014/0133211 A1 May 15, 2014

(51) Int. Cl.
G11C 7/00 (2006.01)
G11C 7/12 (2006.01)
G11C 11/02 (2006.01)
(Continued)

(52) U.S. Cl.
CPC ...... *G11C 7/12* (2013.01); *G11C 11/02* (2013.01); *G11C 11/2297* (2013.01); *G11C 11/34* (2013.01); *G11C 5/12* (2013.01); *G11C 11/1673* (2013.01); *G11C 7/062* (2013.01); *G11C 13/0004* (2013.01); *G11C 13/0007* (2013.01); *G11C 13/0023* (2013.01); *G11C 13/0026* (2013.01); *G11C 13/0028* (2013.01); *G11C 13/0038* (2013.01); *G11C 13/004* (2013.01); *G11C 13/0061* (2013.01); *G11C 13/0069* (2013.01); *G11C 2013/0054* (2013.01); *G11C 2213/78* (2013.01)
USPC .............................. 365/189.14; 365/189.15

(58) Field of Classification Search
CPC ...................... G11C 11/1673; G11C 13/004
USPC .............. 365/189.14, 189.15, 189.07, 189.09
See application file for complete search history.

(56) References Cited

U.S. PATENT DOCUMENTS

| 680,652 | A | 8/1901 | Elden |
| 4,433,468 | A | 2/1984 | Kawamata |

(Continued)

FOREIGN PATENT DOCUMENTS

| JP | 2005-506703 A | 3/2005 |
| JP | 2006-032951 A | 2/2006 |

(Continued)

OTHER PUBLICATIONS

Jian Hu et al., "Area-Dependent Switching in Thin Film-Silicon Devices", Materials Research Society, Mal. Res. Soc. Symp Proc., 2003, pp. A18.3.1-A18.3.6, vol. 762.

(Continued)

*Primary Examiner* — Vu Le
(74) *Attorney, Agent, or Firm* — Ogawa P.C.

(57) ABSTRACT

Providing for a two-terminal memory architecture that can mitigate sneak path current in conjunction with memory operations is described herein. By way of example, a voltage mimicking mechanism can be employed to dynamically drive un-selected bitlines of the memory architecture at a voltage observed by a selected bitline. According to these aspects, changes observed by the selected bitline can be applied to the un-selected bitlines as well. This can help reduce or avoid voltage differences between the selected bitline and the un-selected bitlines, thereby reducing or avoiding sneak path currents between respective bitlines of the memory architecture. Additionally, an input/output based configuration is provided to facilitate reduced sneak path current according to additional aspects of the subject disclosure.

20 Claims, 11 Drawing Sheets

(51) Int. Cl.
  *G11C 11/22* (2006.01)
  *G11C 11/34* (2006.01)
  *G11C 5/12* (2006.01)
  *G11C 11/16* (2006.01)
  *G11C 7/06* (2006.01)
  *G11C 13/00* (2006.01)

(56) References Cited

U.S. PATENT DOCUMENTS

| | | |
|---|---|---|
| 4,684,972 A | 8/1987 | Owen et al. |
| 4,741,601 A | 5/1988 | Saito |
| 5,139,911 A | 8/1992 | Yagi et al. |
| 5,242,855 A | 9/1993 | Oguro |
| 5,278,085 A | 1/1994 | Maddox, III et al. |
| 5,315,131 A | 5/1994 | Kishimoto et al. |
| 5,335,219 A | 8/1994 | Ovshinsky et al. |
| 5,360,981 A | 11/1994 | Owen et al. |
| 5,457,649 A | 10/1995 | Eichman et al. |
| 5,538,564 A | 7/1996 | Kaschmitter |
| 5,541,869 A | 7/1996 | Rose et al. |
| 5,594,363 A | 1/1997 | Freeman et al. |
| 5,614,756 A | 3/1997 | Forouhi et al. |
| 5,645,628 A | 7/1997 | Endo et al. |
| 5,714,416 A | 2/1998 | Eichman et al. |
| 5,751,012 A | 5/1998 | Wolstenholme et al. |
| 5,840,608 A | 11/1998 | Chang |
| 5,970,332 A | 10/1999 | Pruijmboom et al. |
| 5,998,244 A | 12/1999 | Wolstenholme et al. |
| 6,122,318 A | 9/2000 | Yamaguchi et al. |
| 6,128,214 A | 10/2000 | Kuekes et al. |
| 6,143,642 A | 11/2000 | Sur, Jr. et al. |
| 6,180,998 B1 | 1/2001 | Crafts |
| 6,259,116 B1 | 7/2001 | Shannon |
| 6,291,836 B1 | 9/2001 | Kramer et al. |
| 6,436,765 B1 | 8/2002 | Liou et al. |
| 6,436,818 B1 | 8/2002 | Hu et al. |
| 6,473,340 B1 * | 10/2002 | Pasotti et al. ............ 365/185.21 |
| 6,492,694 B2 | 12/2002 | Noble et al. |
| 6,627,530 B2 | 9/2003 | Li et al. |
| 6,762,474 B1 | 7/2004 | Mills, Jr. |
| 6,768,157 B2 | 7/2004 | Krieger et al. |
| 6,815,286 B2 | 11/2004 | Krieger et al. |
| 6,838,720 B2 | 1/2005 | Krieger et al. |
| 6,848,012 B2 | 1/2005 | LeBlanc et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,881,994 B2 | 4/2005 | Lee et al. |
| 6,894,934 B2 * | 5/2005 | De Santis et al. ........ 365/189.07 |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,102,150 B2 | 9/2006 | Harshfield et al. |
| 7,122,853 B1 | 10/2006 | Gaun et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,254,053 B2 | 8/2007 | Krieger et al. |
| 7,289,353 B2 | 10/2007 | Spitzer et al. |
| 7,324,363 B2 | 1/2008 | Kerns et al. |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,499,355 B2 | 3/2009 | Scheuerlein et al. |
| 7,521,705 B2 | 4/2009 | Liu |
| 7,534,625 B2 | 5/2009 | Karpov et al. |
| 7,541,252 B2 | 6/2009 | Eun et al. |
| 7,550,380 B2 | 6/2009 | Elkins et al. |
| 7,566,643 B2 | 7/2009 | Czubatyi et al. |
| 7,606,059 B2 | 10/2009 | Toda |
| 7,615,439 B1 | 11/2009 | Schricker et al. |
| 7,629,198 B2 | 12/2009 | Kumar et al. |
| 7,719,001 B2 | 5/2010 | Nomura et al. |
| 7,728,318 B2 | 6/2010 | Raghuram et al. |
| 7,729,158 B2 | 6/2010 | Toda et al. |
| 7,749,805 B2 | 7/2010 | Pinnow et al. |
| 7,772,581 B2 | 8/2010 | Lung |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,824,956 B2 | 11/2010 | Schricker et al. |
| 7,829,875 B2 | 11/2010 | Scheuerlein |
| 7,835,170 B2 | 11/2010 | Bertin et al. |
| 7,859,884 B2 | 12/2010 | Scheuerlein |
| 7,875,871 B2 | 1/2011 | Kumar et al. |
| 7,881,097 B2 | 2/2011 | Hosomi et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,968,419 B2 | 6/2011 | Li et al. |
| 7,972,897 B2 | 7/2011 | Kumar et al. |
| 8,004,882 B2 | 8/2011 | Katti et al. |
| 8,018,760 B2 | 9/2011 | Muraoka et al. |
| 8,021,897 B2 | 9/2011 | Sills et al. |
| 8,045,364 B2 | 10/2011 | Schloss et al. |
| 8,054,674 B2 | 11/2011 | Tamai et al. |
| 8,067,815 B2 | 11/2011 | Chien et al. |
| 8,071,972 B2 | 12/2011 | Lu et al. |
| 8,084,830 B2 | 12/2011 | Kanno et al. |
| 8,088,688 B1 | 1/2012 | Herner |
| 8,097,874 B2 | 1/2012 | Venkatasamy et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,207,064 B2 | 6/2012 | Bandyopadhyay et al. |
| 8,227,787 B2 | 7/2012 | Kumar et al. |
| 8,233,308 B2 | 7/2012 | Schricker et al. |
| 8,237,146 B2 | 8/2012 | Kreupl et al. |
| 8,265,136 B2 | 9/2012 | Hong et al. |
| 8,374,018 B2 | 2/2013 | Lu |
| 8,385,100 B2 | 2/2013 | Kau et al. |
| 8,394,670 B2 | 3/2013 | Herner |
| 8,467,227 B1 | 6/2013 | Jo |
| 8,658,476 B1 | 2/2014 | Sun et al. |
| 8,659,003 B2 | 2/2014 | Herner et al. |
| 2003/0141565 A1 | 7/2003 | Hirose et al. |
| 2003/0174574 A1 | 9/2003 | Perner et al. |
| 2003/0206659 A1 | 11/2003 | Hamanaka |
| 2004/0026682 A1 | 2/2004 | Jiang |
| 2004/0170040 A1 | 9/2004 | Rinerson et al. |
| 2005/0020510 A1 | 1/2005 | Benedict |
| 2005/0029587 A1 | 2/2005 | Harshfield |
| 2005/0041498 A1 | 2/2005 | Resta et al. |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2005/0175099 A1 | 8/2005 | Sarkijarvi et al. |
| 2006/0017488 A1 | 1/2006 | Hsu |
| 2006/0281244 A1 | 12/2006 | Ichige et al. |
| 2007/0008773 A1 | 1/2007 | Scheuerlein |
| 2007/0015348 A1 | 1/2007 | Hsu et al. |
| 2007/0045615 A1 | 3/2007 | Cho et al. |
| 2007/0087508 A1 | 4/2007 | Herner |
| 2007/0090425 A1 | 4/2007 | Kumar et al. |
| 2007/0091685 A1 | 4/2007 | Guterman et al. |
| 2007/0105284 A1 | 5/2007 | Herner |
| 2007/0105390 A1 | 5/2007 | Oh |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |

(56) References Cited

U.S. PATENT DOCUMENTS

| | | |
|---|---|---|
| 2007/0295950 A1 | 12/2007 | Cho et al. |
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz de Araujo et al. |
| 2008/0106926 A1 | 5/2008 | Brubaker et al. |
| 2008/0185567 A1 | 8/2008 | Kumar et al. |
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0232160 A1 | 9/2008 | Gopalakrishnan |
| 2008/0278990 A1 | 11/2008 | Kumar et al. |
| 2008/0304312 A1 | 12/2008 | Ho et al. |
| 2008/0311722 A1 | 12/2008 | Petti et al. |
| 2009/0001345 A1 | 1/2009 | Schricker et al. |
| 2009/0003717 A1 | 1/2009 | Sekiguchi et al. |
| 2009/0014707 A1 | 1/2009 | Lu et al. |
| 2009/0052226 A1 | 2/2009 | Lee et al. |
| 2009/0095951 A1 | 4/2009 | Kostylev et al. |
| 2009/0152737 A1 | 6/2009 | Harshfield |
| 2009/0168486 A1 | 7/2009 | Kumar |
| 2009/0231910 A1 | 9/2009 | Liu et al. |
| 2009/0250787 A1 | 10/2009 | Kutsunai |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0298224 A1 | 12/2009 | Lowrey |
| 2009/0321789 A1 | 12/2009 | Wang et al. |
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0032638 A1 | 2/2010 | Xu |
| 2010/0032640 A1 | 2/2010 | Xu |
| 2010/0034518 A1 | 2/2010 | Iwamoto et al. |
| 2010/0044708 A1 | 2/2010 | Lin et al. |
| 2010/0046622 A1 | 2/2010 | Doser et al. |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157651 A1 | 6/2010 | Kumar et al. |
| 2010/0157710 A1 | 6/2010 | Lambertson et al. |
| 2010/0163828 A1 | 7/2010 | Tu |
| 2010/0176368 A1 | 7/2010 | Ko et al. |
| 2010/0219510 A1 | 9/2010 | Scheuerlein et al. |
| 2010/0221868 A1 | 9/2010 | Sandoval |
| 2010/0321095 A1 | 12/2010 | Mikawa et al. |
| 2011/0006275 A1 | 1/2011 | Roelofs et al. |
| 2011/0089391 A1 | 4/2011 | Mihnea et al. |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0155991 A1 | 6/2011 | Chen |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo et al. |
| 2011/0312151 A1 | 12/2011 | Herner |
| 2011/0317470 A1 | 12/2011 | Lu et al. |
| 2012/0001146 A1 | 1/2012 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043520 A1 | 2/2012 | Herner et al. |
| 2012/0043621 A1 | 2/2012 | Herner |
| 2012/0043654 A1 | 2/2012 | Lu et al. |
| 2012/0076203 A1 | 3/2012 | Sugimoto et al. |
| 2012/0080798 A1 | 4/2012 | Harshfield |
| 2012/0104351 A1 | 5/2012 | Wei et al. |
| 2012/0108030 A1 | 5/2012 | Herner |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0155146 A1 | 6/2012 | Ueda et al. |
| 2012/0205606 A1 | 8/2012 | Lee et al. |
| 2012/0220100 A1 | 8/2012 | Herner |
| 2012/0235112 A1 | 9/2012 | Huo et al. |
| 2012/0236625 A1 | 9/2012 | Ohba et al. |
| 2012/0269275 A1 | 10/2012 | Hannuksela et al. |
| 2012/0305874 A1 | 12/2012 | Herner |
| 2012/0326265 A1 | 12/2012 | Lai et al. |

FOREIGN PATENT DOCUMENTS

| | | |
|---|---|---|
| JP | 2007-067408 A | 3/2007 |
| JP | 2007-281208 A | 10/2007 |
| JP | 2007-328857 A | 12/2007 |
| KR | 1020110014248 A | 2/2011 |
| WO | WO 03/034498 A1 | 4/2003 |
| WO | WO 2009/005699 A1 | 1/2009 |

OTHER PUBLICATIONS

André Dehon, "Array-Based Architecture for FET-Based, Nanoscale Electronics", IEEE Transactions on Nanotechnology, Mar. 2003, pp. 23-32, vol. 2, No. 1, IEEE.

Herb Goronkin et al., "High-Performance Emerging Solid-State Memory Technologies", MRS Bulletin, www.mrs.org/publications/bulletin, Nov. 2004, pp. 805-813.

Gerhard Müller et al., "Status and Outlook of Emerging Nonvolatile Memory Technologies", IEEE, 2004, pp. 567-570.

A.E. Owen et al., "Memory Switching in Amorphous Silicon Devices", Journal of Non-Crystalline Solids 59 & 60, 1983, pp. 1273-1280, North Holland Publishing Company/Physical Society of Japan.

J. Campbell Scott, "Is There an Immortal Memory?", www.sciencemag.org, Apr. 2, 2004, pp. 62-63, vol. 304 No. 5667, American Association for the Advancement of Science.

S.H. Lee et al., "Full Integration and Cell Characteristics for 64Mb Nonvolatile PRAM", 2004 Symposium on VLSI Technology Digest of Technical Papers, IEEE, 2004, pp. 20-21.

Stephen Y. Chou et al., "Imprint Lithography With 25-Nanometer Resolution", Science, Apr. 5, 1996, pp. 85-87, vol. 272, American Association for the Advancement of Science.

S. Zankovych et al., "Nanoimprint Lithography: challenges and prospects", Nanotechnology, 2001, pp. 91-95, vol. 12, Institute of Physics Publishing.

A. Avila et al., "Switching in coplanar amorphous hydrogenated silicon devices", Solid-State Electronics, 2000, pp. 17-27, vol. 44, Elsevier Science Ltd.

Jian Hu et al., "Switching and filament formation in hot-wire CVD p-type a-Si:H devices", Thin Solid Films, Science Direct, www.sciencedirect.com, 2003, pp. 249-252, vol. 430, Elsevier Science B.V.

S. Hudgens et al., "Overview of Phase-Change Chalcogenide Nonvolatile Memory Technology", MRS Bulletin, www.mrs.org/publications/bulletin, Nov. 2004, pp. 829-832.

K. Terabe et al., "Quantized conductance atomic switch", Nature, www.nature.com/nature, Jan. 6, 2005, pp. 47-50, vol. 433, Nature Publishing Group.

Michael Kund et al., "Conductive bridging RAM (CBRAM): An emerging non-volatile memory technology scalable to sub 20nm", IEEE, 2005.

W. Den Boer, "Threshold switching in hydrogenated amorphous silicon", Appl. Phys. Letter, 1982, pp. 812-813, vol. 40, American Institute of Physics.

(56) References Cited

OTHER PUBLICATIONS

P.G. Lecomber et al., "The Switching Mechanism in Amorphous Silicon Junctions", Journal of Non-Crystalline Solids,1985, pp. 1373-1382, vol. 77 & 78, Elsevier Science Publishers B.V., North Holland Physics Publishing Division, North-Holland, Amsterdam.
A. E. Owen et al., "Switching in amorphous devices", Int. J. Electronics, 1992, pp. 897-906, vol. 73, No. 5, Taylor and Francis Ltd.
M. Jafar et al., "Switching in amorphous-silicon devices", Physical Review B, May 15, 1994, pp. 611-615, vol. 49, No. 19, The American Physical Society.
Alexandra Stikeman, "Polymer Memory—The plastic path to better data storage", Technology Review, www.technologyreview.com, Sep. 2002, pp. 31.
Yong Chen et al., "Nanoscale molecular-switch crossbar circuits", Nanotechnology, 2003, pp. 462-468, vol. 14, Institute of Physics Publishing Ltd.
C. P. Collier et al., "Electronically Configurable Molecular-Based Logic Gates", Science Jul. 16, 1999, pp. 391-395, vol. 285, No. 5426, American Association for the Advancement of Science.
Office Action for U.S. Appl. No. 11/875,541 dated Jul. 22, 2010.
Office Action for U.S. Appl. No. 11/875,541 dated Mar. 30, 2011.
Office Action for U.S. Appl. No. 11/875,541 dated Oct. 5, 2011.
Office Action for U.S. Appl. No. 11/875,541 dated Jun. 8, 2012.
Jang Wook Choi, "Bistable [2]Rotaxane Based Molecular Electronics: Fundamentals and Applications", Dissertation, Chapter 3, <http://resolver.caltech.edu/CaltechETD:etd-05242007-194737> 2007, pp. 79-120, California Institute of Technology, Pasadena.
Sung-Hyun Jo et al., "A Silicon-Based Crossbar Ultra-High-Density Non-Volatile Memory", SSEL Annual Report 2007.
International Search Report for PCT/US2009/060023 filed on Oct. 8, 2009.
Rainer Waser et al., "Nanoionics-based resistive switching memories", Nature Materials, Nov. 2007, pp. 833-835, vol. 6, Nature Publishing Group.
Written Opinion of the International Searching Authority for PCT/US2009/060023 filed on Oct. 8, 2009.
Ex parte Quayle Action for U.S. Appl. No. 12/826,653 dated May 8, 2012.
International Search Report for PCT/US2011/040090 filed on Jun. 10, 2011.
Written Opinion of the International Searching Authority for PCT/US2011/040090 filed on Jun. 10, 2011.
Notice of Allowance for U.S. Appl. No. 13/158,231 dated Apr. 17, 2012.
Office Action for U.S. Appl. No. 12/835,704 dated Sep. 21, 2011.
Office Action for U.S. Appl. No. 12/835,704 dated Mar. 1, 2012.
Advisory Action for U.S. Appl. No. 12/835,704 dated Jun. 8, 2012.
International Search Report and Written Opinion for PCT/US2011/046035 filed on Jul. 29, 2011.
Office Action for U.S. Appl. No. 12/861,650 dated Jan. 25, 2012.
Notice of Allowance for U.S. Appl. No. 12/861,650 dated Jun. 19, 2012.
Sung Hyun Jo et al., "Programmable Resistance Switching in Nanoscale Two-Terminal Devices," Supporting Information, Dec. 29, 2008, pp. 1-4, vol. 9., No. 1, Department of Electrical Engineering and Computer Science, the University of Michigan, Ann Arbor, Michigan.
Kuk-Hwan Kim et al., "Nanoscale resistive memory with intrinsic diode characteristics and long endurance," Applied Physics Letters, 2010, pp. 053106-1-053106-3, vol. 96, American Institute of Physics.
Sung Hyun Jo et al., "Si-Based Two-Terminal Resistive Switching Nonvolatile Memory", IEEE, 2008.
Sung Hyun Jo et al., "Nanoscale Memristor Device as Synapse in Neuromorphic Systems", Nano Letters, 10, 1297-1301, 2010, pubs.acs.org/NanoLett, A-E, American Chemical Society Publications.
Wei Lu et al., "Nanoelectronics from the bottom up", Nature Materials, www.nature.com/naturematerials, Nov. 2007, pp. 841-850, vol. 6, Nature Publishing Group.

Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.
Sung Hyun Jo et al., "Experimental, Modeling and Simulation Studies of Nanoscale Resistance Switching Devices", $9^{th}$ Conference on Nanotechnology, IEEE, 2009, pp. 493-495.
Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.
Sung Hyun Jo et al., "Si Memristive Devices Applied to Memory and Neuromorphic Circuits", Proceedings of 2010 IEEE International Symposium on Circuits and Systems, 2010, pp. 13-16.
Wei Lu et al., "Supporting Information", 2008.
Sung Hyun Jo et al., "High-Density Crossbar Arrays Based on a Si Memristive System", Nano Letters, 2009, pp. 870-874, vol. 9 No. 2, American Chemical Society Publications.
Sung Hyun Jo et al., "High-Density Crossbar Arrays Based on a Si Memristive System", Supporting Information, 2009, pp. 1-4.
Sung Hyun Jo et al., "Programmable Resistance Switching in Nanoscale Two-Terminal Devices", Nano Letters, 2009, pp. 496-500, vol. 9 No. 1, American Chemical Society Publications.
Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.
S. K. Dey, "Electrothermal model of switching in amorphous silicon films", J. Vac. Sci. Technol., Jan./Feb. 1980, pp. 445-448, vol. 17, No. 1, American Vacuum Society.
J. Hajto et al., "The Programmability of Amorphous Silicon Analogue Memory Elements", Mat. Res. Soc. Symp. Proc., 1990, pp. 405-410, vol. 192, Materials Research Society.
M. J. Rose et al., "Amorphous Silicon Analogue Memory Devices", Journal of NonCrystalline Solids, 1989, pp. 168-170, vol. 115, Elsevier Science Publishers B.V., North-Holland.
A. Moopenn et al., "Programmable Synaptic Devices for Electronic Neural Nets", Control and Computers, 1990, pp. 37-41, vol. 18 No. 2.
P.G. Le Comber, "Present and Future Applications of Amorphous Silicon and Its Alloys", Journal of Non-Crystalline Solids, 1989, pp. 1-13, vol. 115, Elsevier Science Publishers B.V., North-Holland.
J. Hu, et al., "AC Characteristics of $Cr/p^+a$-Si:H/V Analog Switching Devices", IEEE Transactions on Electron Devices, Sep. 2000, pp. 1751-1757, vol. 47 No. 9, IEEE.
A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.
J. Hajto et al., "Amorphous & Microcrystalline Semiconductor Devices: vol. 2, Materials and Device Physics", Mar. 1, 2004, pp. 640-700, Artech House Publishers.
J. Hajto et al., "Analogue memory and ballistic electron effects in metal-amorphous silicon structures", Philosophical Magazine B, 1991, pp. 349-369, vol. 63 No. 1, Taylor & Francis Ltd.
A. J. Holmes et al., "Design of Analogue Synapse Circuits using Non-Volatile a-Si:H Memory Devices", Proceedings of ISCAS, 1994, pp. 351-354.
Yajie Dong et al., "Si/a-Si Core/Shell Nanowires as Nonvolatile Crossbar Switches", Nano Letters, Jan. 2008, pp. 386-391, vol. 8 No. 2, American Chemical Society.
European Search Report for Application No. EP 09 81 9890.6 of Mar. 27, 2012.
D. A. Muller et al., "The Electronic structure at the atomic scale of ultrathin gate oxides", Nature, Jun. 24, 1999, pp. 758-761, vol. 399.
J. Suñé et al., "Nondestructive multiple breakdown events in very thin $SiO_2$ films", Applied Physics Letters, 1989, pp. 128-130, vol. 55.
Herve Marand et al., MESc. 5025 lecture notes: Chapter 7. Diffusion, University of Vermont, http://www.files.chem.vt.edu/chem-dept/marand/MEScchap6-1c.pdf.
A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.

(56) References Cited

OTHER PUBLICATIONS

Sung Hyun Jo, "Nanoscale Memristive Devices for Memory and Logic Applications", Ph. D dissertation, University of Michigan, 2010.
Office Action for U.S. Appl. No. 12/894,098 dated Aug. 1, 2012.
Sung Hyun Jo et al., "CMOS Compatible Nanoscale Nonvolatile Resistance Switching Memory", Nano Letters, 2008, pp. 392-397, vol. 8, No. 2.
Office Action for U.S. Appl. No. 12/582,086 dated Apr. 19, 2011.
Office Action for U.S. Appl. No. 12/582,086 dated Sep. 6, 2011.
Notice of Allowance for U.S. Appl. No. 12/582,086 dated Oct. 21, 2011.
International Search Report for PCT/US2009/061249 filed on Oct. 20, 2009.
Written Opinion of the International Searching Authority for PCT/US2009/061249 filed on Oct. 20, 2009.
Office Action for U.S. Appl. No. 12/861,650 dated Oct 16, 2012.
Notice of Allowance for U.S. Appl. No. 12/894,087 dated Oct. 25, 2012.
Notice of Allowance for U.S. Appl. No. 13/149,807 dated Oct. 29, 2012.
Notice of Allowance for U.S. Appl. No. 12/861,666 dated Nov. 14, 2012.
Office Action for U.S. Appl. No. 13/156,232, dated Nov. 26, 2012.
Notice of Allowance for U.S. Appl. No. 13/290,024 dated Nov. 28, 2012.
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 dated Feburary 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
International Search Report for PCT/US2011/045124 filed on Jul. 22, 2011.
Written Opinion of the International Searching Authority for PCT/US2011/045124 filed on Jul. 22, 2011.
Peng-Heng Chang et al., "Aluminum spiking at contact windows in Al/Ti-W/Si", Appl. Phys. Lett., Jan. 25, 1988, pp. 272-274, vol. 52 No. 4, American Institute of Physics.
J. Del Alamo et al., "Operating Limits of Al-Alloyed High-Low Junctions for BSF Solar Cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Office Action for Application No. EP 1100 5207.3 dated Aug. 8, 2012.
Office Action for U.S. Appl. No. 13/417,135 dated Oct. 9, 2012.
Notice of Allowance for U.S. Appl. No. 13/532,019 dated Nov. 14, 2012.
Office Action for U.S. Appl. No. 13/149,653 dated Nov. 20, 2012.
Notice of Allowance for U.S. Appl. No. 13/725,331, dated Jan. 17, 2014.
Office Action for U.S. Appl. No. 13/739,283, dated Jan. 16, 2014.
Office Action for U.S. Appl. No. 13/920,021, dated Jan. 10, 2014.
Office Action for U.S. Appl. No. 12/861,432, dated Jan. 8, 2014.
Office Action for U.S. Appl. No. 13/586,815, dated Jan. 29, 2014.
International Search Report and Written Opinion for PCT/US2013/061244, filed on Sep. 23, 2013.
Office Action for U.S. Appl. No. 13/434,567, dated Feb. 6, 2014.
Office Action for U.S. Appl. No. 13/620,012, dated Feb. 11, 2014.
Notice of Allowance for U.S. Appl. No. 13/468,201, dated Feb. 20, 2014.
Office Action for U.S. Appl. No. 12/625,817, dated Feb. 28, 2014.
Office Action for U.S. Appl. No. 12/835,704, dated Mar. 14, 2014.
Office Action for U.S. Appl. No. 13/870,919, Dated Apr. 3, 2014.
Office Action for U.S. Appl. No. 13/167,920, dated Mar. 12, 2014.
International Search Report and Written Opinion for PCT/US2013/077628, filed on Dec. 23, 2013.
Office Action for U.S. Appl. No. 13/143,047, dated Apr. 11, 2014.
Office Action for U.S. Appl. No. 13/761,132, dated Apr. 25, 2014.
Notice of Allowance for U.S. Appl. No. 12/814,410, dated Jan. 8, 2013.
Corrected Notice of Allowance for U.S. Appl. No. 12/861,666, dated Jan. 11, 2013.
Supplemental Notice of Allowance for U.S. Appl. No. 12/894,087, dated Jan. 11, 2013.
Notice of Allowance for U.S. Appl. No. 13/314,513, dated Jan. 24, 2013.
Notice of Allowance for U.S. Appl. No. 13/118,258, dated Feb. 6, 2013.
International Search Report and Written Opinion for PCT/US2012/040242, filed May 31, 2012.
Office Action for U.S. Appl. No. 13/174,264, dated Mar. 6, 2013.
Office Action for U.S. Appl. No. 13/679,976, dated Mar. 6, 2013.
Notice of Allowance for U.S. Appl. No. 12/894,098, dated Mar. 15, 2013.
Office Action for U.S. Appl. No. 13/465,188, dated Mar. 19, 2013.
Office Action for U.S. Appl. No. 12/861,432, dated Mar. 29, 2013.
Notice of Allowance for U.S. Appl. No. 13/748,490, dated Apr. 9, 2013.
Office Action for U.S. Appl. No. 13/725,331, dated May 20, 2013.
International Search Report and Written Opinion for PCT/US2012/045312, filed on Jul. 2, 2012.
Office Action for U.S. Appl. No. 13/466,008, dated Jul. 29, 2013.
Russo, Ugo et al., "Self-Accelerated Thermal Dissolution Model for Reset Programming in Unipolar Resistive-Switching Memory (RRAM) Devices", IEEE Transactions on Electron Devices, Feb. 2009, pp. 193-200, vol. 56, No. 2.
Cagli, C. et al., "Evidence for threshold switching in the set process of NiO-based RRAM and physical modeling for set, reset, retention and disturb prediction", IEEE International Electron Devices Meeting, Dec. 15-17, 2008, pp. 1-4, San Francisco, CA.
Office Action for U.S. Appl. No. 13/077,941, dated Aug. 12, 2013.
Office Action for U.S. Appl. No. 13/436,714, dated Aug. 27, 2013.
Notice of Allowance for U.S. Appl. No. 13/679,976, dated Sep. 17, 2013.
Office Action for U.S. Appl. No. 13/189,401, dated Sep. 30, 2013.
Office Action for U.S. Appl. No. 13/462,653, dated Sep. 30, 2013.
Corrected Notice of Allowance for U.S. Appl. No. 13/733,828, dated Oct. 1, 2013.
Notice of Allowance for U.S. Appl. No. 13/733,828, dated Aug. 8, 2013.
Office Action for U.S. Appl. No. 13/594,665, dated Aug. 2, 2013.
Notice of Allowance for U.S. Appl. No. 13/769,152, dated Oct. 8, 2013.
Notice of Allowance for U.S. Appl. No. 13/905,074, dated Oct. 8, 2013.
Notice of Allowance for U.S. Appl. No. 13/452,657, dated Oct. 10, 2013.
Notice of Allowance for U.S. Appl. No. 13/174,264, dated Oct. 16, 2013.
Notice of Allowance for U.S. Appl. No. 13/417,135, dated Oct. 23, 2013.
Office Action of U.S. Appl. No. 13/436,714, dated Dec. 7, 2012.

\* cited by examiner

US 8,982,647 B2

RESISTIVE RANDOM ACCESS MEMORY EQUALIZATION AND SENSING

TECHNICAL FIELD

The subject disclosure relates generally to semiconductor electronics, and more particularly to signal equalization for resistive random access memory in conjunction with memory sensing.

BACKGROUND

A recent innovation within the field of integrated circuit technology is the resistive random access memory (RRAM). While much of RRAM technology is in the development stage, various technological concepts for RRAM have been demonstrated and are in one or more stages of verification to prove or disprove associated theory(ies). Even so, RRAM technology promises to hold substantial advantages for future growth in the semiconductor electronics industry.

According to various theoretical models, the RRAM can be configured to have multiple resistive states; for instance, the RRAM can be configured to have a relatively low resistance or a relatively high resistance. Moreover, the RRAM can generally be configured to enter one or another resistive state in response to an external condition imposed upon the RRAM. Thus, in transistor parlance, applying or removing the external condition can serve to program or de-program the RRAM. Moreover, depending on physical makeup and electrical arrangement, an RRAM can generally maintain a programmed or de-programmed state. Maintaining a state might require other conditions be met (e.g., existence of a minimum operating voltage, existence of a minimum operating temperature, . . . ), or no conditions be met, depending on a makeup of the RRAM. Generally speaking, the capacity to be in one of two states and maintain one or another of the states can serve to represent one binary bit of information. Thus, RRAM is theoretically usable as electronic memory in suitably arranged electronic circuits.

Several proposals for practical utilization of RRAM technology include various transistor-based memory applications. For instance, RRAM elements are often theorized as viable alternatives, at least in part, to metal-oxide semiconductor (MOS) type memory transistors commonly employed for electronic storage of digital information. Models of RRAM-based memory devices provide some potential advantages over non-volatile FLASH MOS type transistors, including smaller die size, higher memory density, fast switching (e.g., from a relatively conductive state to a relatively non-conductive state, or vice versa), good data reliability, low manufacturing cost, and others. Because of these potential benefits, and because demand for faster and smaller electronic devices appears to continue unabated, much interest in RRAM technology and RRAM development exists.

SUMMARY

The following presents a simplified summary of the subject disclosure in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

Aspects of the subject disclosure provide for a resistive random access memory (RRAM) architecture that can mitigate sneak path current (also referred to herein as leak current) in conjunction with electronic memory applications. Such applications can include, but are not limited to, a program (or write) application, a read application, or an erase application. Particular aspects disclose employing a voltage mimicking mechanism to dynamically drive un-selected bitlines of the electronic memory at a voltage observed by a selected bitline. According to these aspects, time-varying changes observed by the selected bitline can be applied to the un-selected bitlines as well. This can help reduce or avoid voltage differences between the selected bitline and the un-selected bitlines, thereby also reducing or avoiding sneak path currents between respective bitlines of the RRAM architecture.

In one or more aspects is disclosed an input/output (I/O) based memory architecture. The I/O based memory architecture can facilitate improvements in reduced sneak path current as disclosed herein. Particularly, the I/O based memory architecture can be configured to connect respective I/O contacts of a memory array comprising multiple blocks of memory, to a subset of bitlines of respective blocks of memory. As one illustrative example, a single I/O contact could be connected to one bitline of a first block of memory, another bitline of a second block of memory, and so on, to reduce or avoid leak current between bitlines within a particular block of memory (e.g., the first block of memory, the second block of memory, . . . ) measured at the single I/O contact. By isolating non-selected blocks of memory from the I/O contact, leak current among different blocks of memory can also be mitigated or avoided.

In another aspect(s), disclosed is a sense amplifier for measuring signal characteristics of an RRAM array. The sense amplifier can be configured to facilitate a mimicking circuit, similar to the mimicking mechanism described above, to dynamically drive non-selected bitlines and a selected bitline with a common signal. Further, the sense amplifier can be pre-charged to further mitigate or avoid leak current in an RRAM array.

In still other aspects, disclosed is a Y multiplexing (YMUX) circuit. The YMUX circuit can be configured for interconnecting various portions of an RRAM array to facilitate memory operations on subsets of the RRAM array (e.g., respective blocks of memory, respective bitlines, . . . ). In particular aspects, the YMUX can be configured to selectively connect a subset of bitlines or a subset of blocks of memory with an I/O contact(s). In further aspects, the YMUX circuit can be configured to selectively apply a mimicked voltage (e.g., a mimicked bias voltage) to dynamically selected subsets of bitlines of the RRAM array. Dynamic selection of subsets of bitlines can provide a flexible circuit that responds quickly to memory cell selections and facilitates real-time sneak path mitigation in conjunction with RRAM sensing or other memory operations.

In a further aspect, the subject disclosure provides a semiconductor memory. The semiconductor memory can comprise a set of RRAM, and a set of bitlines connected to respective subsets of the set of RRAM and configured to activate or deactivate respective ones of the subsets of the set of RRAM by application of a bias voltage. Furthermore, the semiconductor memory can comprise a bias voltage replication circuit configured to dynamically track an observed voltage at a selected one of the set of bitlines resulting from application of the bias voltage to the selected one of the set of bitlines, and to apply the dynamically tracked observed voltage to a non-selected one of the set of bitlines.

In one or more additional aspects, provided is a method of fabricating a semiconductor memory. The method can comprise forming a plurality of bitlines and a plurality of wordlines onto the semiconductor memory and forming an array of resistive random access memory (RRAM) having columns aligned along respective ones of the plurality of bitlines and rows aligned along respective ones of the plurality of wordlines. Moreover, the method can comprise connecting respective first contacts of respective ones of the array of RRAM to one of the plurality of bitlines and respective second contacts of the respective ones of the array of RRAM to one of the plurality of wordlines and forming a multiplexer circuit in the semiconductor memory configured for selectively applying an operation signal at least to a subset of the plurality of bitlines. In addition, the method can comprise forming an equalization circuit for driving a second subset of the plurality of bitlines with an operation voltage observed at the subset of the plurality of bitlines in response to the operation signal.

In yet another aspect, disclosed herein is a method of operating electronic memory. The method can comprise selecting a wordline of the electronic memory and applying a read voltage to a bitline of the electronic memory that is connected to a RRAM element selected for reading. Furthermore, the method can comprise connecting the bitline to a circuit that dynamically mimics an actual voltage at the bitline of the electronic memory and driving at least one additional bitline adjacent to the bitline with the actual voltage in conjunction with reading a state of the RRAM element.

The following description and the annexed drawings set forth in detail certain illustrative aspects of the disclosed subject matter. These aspects are indicative, however, of but a few of the various ways in which the principles of the innovation can be employed and the disclosed subject matter is intended to include all such aspects and their equivalents. Other advantages and novel features of the disclosed subject matter will become apparent from the following detailed description of the innovation when considered in conjunction with the drawings.

DETAILED DESCRIPTION

Figure 1:
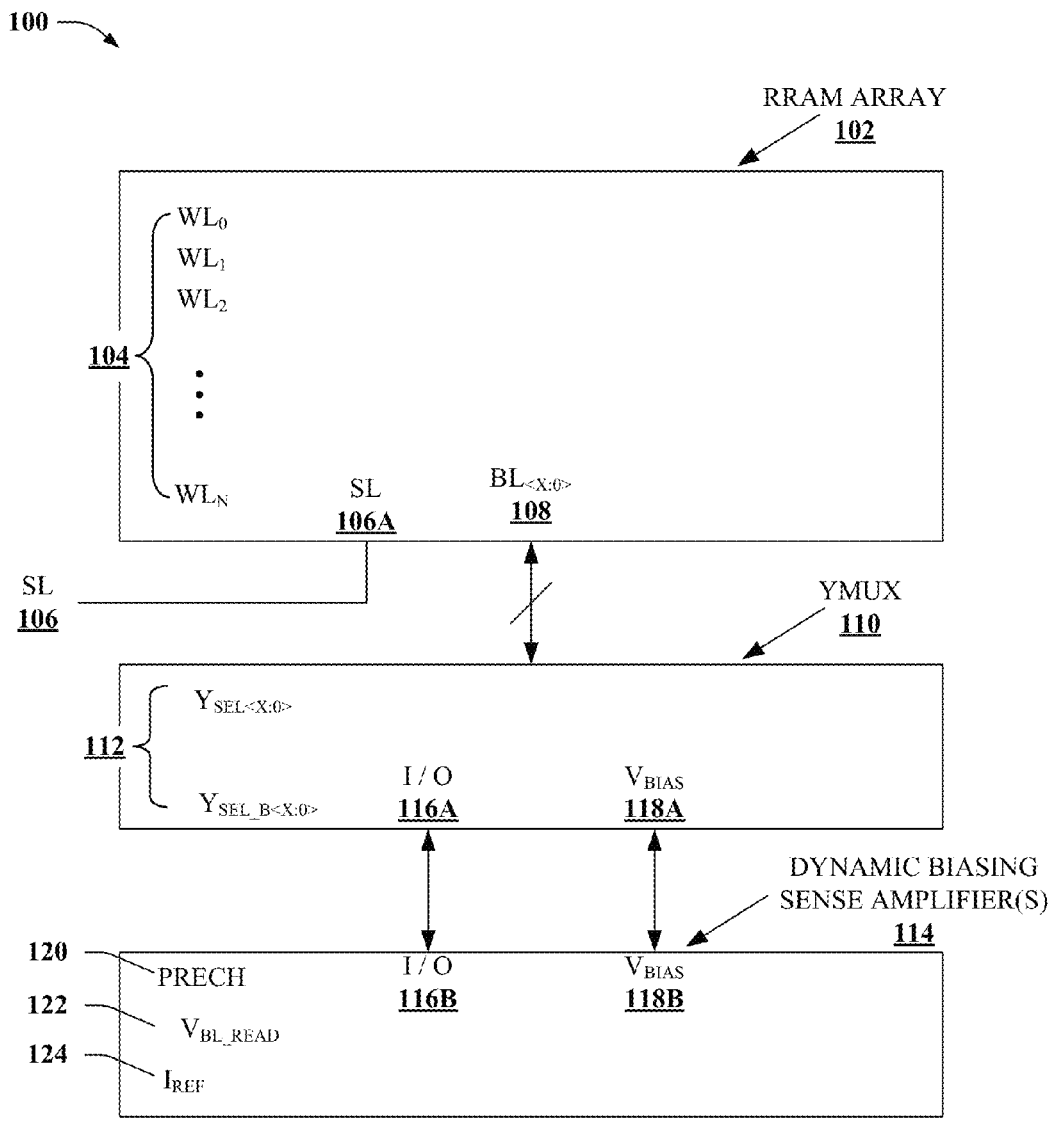
FIG. 1 illustrates a block diagram of an example resistive random access memory circuit architecture according to one or more aspects of the subject disclosure.

The disclosed subject matter is described with reference to the drawings, wherein like reference numerals are used to refer to like elements throughout the description. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram or schematic form in order to facilitate describing the subject innovation.

In various aspects of the subject disclosure, provided is an architecture and one or more circuit components for mitigating or avoiding sneak path current in a two-terminal memory device array. Two-terminal memory devices, as utilized herein, comprise circuit components having two electrical contacts with an active region between the two conductive contacts. The active region of the two-terminal memory device exhibits linear or non-linear non-volatile resistive characteristics in response to a voltage difference applied at the two conductive contacts. Examples of two-terminal memory devices, though not exhaustive, can include resistive random access memory (RRAM), phase-change memory (PCM), a phase-change random access memory (PCRM), a magneto-resistive access memory (MRAM) or a ferroelectric random access memory (FeRAM), or the like, or a suitable combination thereof. As utilized herein, where one type of two-terminal memory device is referenced (e.g., RRAM), it should be appreciated that the scope of the subject disclosure contemplates substitution of other suitable types of two-terminal memory (e.g., PCM, PCRM, MRAM, FeRAM, ... ) for the referenced two-terminal memory, except where otherwise clear from context.

With respect to RRAM, an example of an RRAM can include a filamentary-based RRAM, which in turn can include: a p-type silicon bearing layer (e.g., p-type polysilicon, p-type SiGe), an undoped amorphous silicon layer (i.e., having intrinsic characteristics), and an active metal layer for providing filament forming ions to the amorphous silicon layer (e.g., silver (Ag), gold (Au), nickel (Ni), aluminum (Al), chromium (Cr), iron (Fe), manganese (Mn), tungsten (W), vanadium (V), cobalt (Co), platinum (Pt), and palladium (Pd)). Some details pertaining to RRAM similar to the foregoing example can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties.

It should be appreciated that a variety of RRAM technologies exist, having different physical properties. For instance, different RRAM technologies can have different discrete programmable resistances, different associated program/erase voltages, as well as other differentiating characteristics. For instance, a unipolar RRAM, once initially programmed, can be later programmed in response to a first positive voltage (e.g., three volts) and erased in response to a second positive voltage (e.g., between four and five volts). Bipolar RRAM, on the other hand, becomes programmed in response to a positive voltage and erased in response to a negative voltage. Where no specific RRAM technology or program/erase voltage is specified for the various aspects and embodiments herein, it is intended that such aspects and embodiments incorporate any suitable RRAM technology and be operated by program/erase voltages appropriate to that RRAM technology, as would be known by one of ordinary skill in the art or made known by way of the context provided herein. It should be appreciated further that where substituting a different RRAM technology would require circuit modifications that would be known to one of ordinary skill in the art, or changes to operating signal levels that would be known to one of such skill, embodiments comprising the substituted RRAM technology(ies) or signal level changes are considered within the scope of the subject disclosure.

RRAM memory cells have several advantages over conventional FLASH or metal oxide semiconductor (MOS) memory devices. First, RRAM technology can generally be small, consuming silicon area on the order of $4F^2$ per adjacent RRAM device (e.g., a memory cell comprising two RRAM devices would therefore be approximately $8F^2$ if constructed in adjacent silicon space). Non-adjacent RRAM devices, e.g., stacked above or below each other, can consume as little as $4F^2$ for a set of multiple non-adjacent devices. This leads to great semiconductor component density and memory density, and low manufacturing costs for a given number of transistors. RRAM also has fast programming speed and low programming current, and smaller cell sizes enabling greater component densities. Additionally, RRAM is non-volatile memory, having the capacity to store data without continuous application of power. In addition to the foregoing, RRAM cells can generally be built between metal interconnect layers, enabling RRAM-based devices to be usable for two-dimension as well as three-dimension semiconductor architectures.

One problem common to RRAM-type crossbar memory arrays of many varieties is sneak path current, also referred to as leak current. Sneak path current can result from a voltage difference across adjacent or nearby bitlines of a memory array. For instance, a RRAM memory cell positioned between metal inter-connects (e.g., bitlines and wordlines) of a crossbar array is not a true electrical insulator, and thus a small amount of current can flow in response to the aforementioned voltage differences. Further, these small amounts of current can add together, particularly when caused by multiple voltage differences observed across multiple metal inter-connects. During a memory operation, a sneak path current(s) can co-exist with an operating signal (e.g., program signal, erase signal, read signal, . . . ) and reduce operational margin. For instance, in conjunction with a read operation on a selected memory cell, sneak path current sharing a read path with the selected memory cell can add to a sensing current, reducing sensing margin of read circuitry.

A cross point RRAM configuration (e.g., see FIG. 3, infra) can experience sneak path currents. Because RRAM components positioned at intersections of bitlines and wordlines have finite resistance, small currents resulting from voltage differences of metal inter-connects can occur. These small currents, or sneak path currents, can reduce efficacy of operational margin for RRAM memory architectures.

In some aspects, sneak path current can be mitigated by driving a set of bitlines at a common voltage (e.g., a bias voltage). This intended effect of driving each bitline with a common voltage is to reduce voltage difference among bitlines of the set—at least in theory. In practice, however, voltage of a target bitline can vary a small amount depending on a state of an RRAM connected to the target bitline. For instance, in the context of a read operation, if a selected RRAM is in a conductive state (e.g., a program state) and permits a relatively large amount of current to flow in response to application of a read signal at the target bitline, a voltage observed by the target bitline can change from the nominal bias voltage value. Other RRAM that are not selected will be non-conductive, and permit relatively little current to flow. Bitlines connected to these other RRAM will tend to remain much closer to the bias voltage, resulting in a voltage difference between the target bitline and other bitlines, leading to sneak path currents throughout the array of the unselected cell.

The foregoing problem of voltage difference among metal inter-connects can be readily observed within a given block of memory, comprising sets of closely packed bitlines. This phenomenon can commonly occur in crossbar connected arrays. During a read operation, one row of a selected block of memory is read. Because respective RRAM cells can be in either a program or erase state (in the binary context), voltages of bitlines within the selected block can differ based on program or erase states of RRAM cells on a selected bitline, as well as RRAM cells on non-selected bitlines. Large numbers of bitlines and wordlines can lead to large numbers of sneak path currents, drastically reducing sensing margin of read operations. Thus, group equalization, or driving bitlines with a common bias voltage, can be less than ideal for a word-based RRAM array, since all bitlines of a memory block are connected to a common I/O connect in such an array.

To address the foregoing problems, the subject disclosure dynamically drives non-selected bitlines with an observed voltage of a selected bitline. To accomplish this result, a bias voltage replication circuit is provided that dynamically mimics a voltage of the selected bitline. Further, an output of the bias voltage replication circuit is utilized to bias the non-selected bitlines. In this manner, voltage changes in the selected bitline during a read operation (e.g., resulting from program or erase state of a selected RRAM cell) can be propagated to non-selected bitlines, reducing or avoiding voltage differences among the bitlines. In various other aspects, there is also disclosed a sensing amplifier to facilitate application of the bias voltage replication circuit, a multiplexer (YMUX) for selectively connecting an input and an output of the bias voltage replication circuit to different subsets of RRAM cells, as well as for selectively connecting bitlines to an I/O connect of the sensing amplifier, and an I/O based RRAM architecture for further facilitating mitigation or avoidance of bitline voltage differences and resulting sneak path currents within bitlines of a block of memory.

Referring now to the drawings, FIG. 1 illustrates a block diagram of an example memory architecture 100 according to one or more aspects of the subject disclosure. Memory architecture 100 can be dynamically configured to mitigate or avoid sneak path current in conjunction with operating an RRAM array 102. Accordingly, memory architecture 100 can preserve a substantial amount of sensing margin, potentially reducing read errors in RRAM memory applications.

RRAM array 102 can comprise at least one set of wordlines 104 and at least one set of bitlines 108. Wordlines 104, as depicted, include $WL_0$, $WL_1$, $WL_2$, . . . $WL_N$, where N is a suitable integer greater than one. Further, bitlines 108 include members of the set from 0 to X; stated differently, the set of bitlines 108 includes $BL_0$, $BL_1$, $BL_2$, . . . , $BL_X$, where X is also a suitable integer greater than one. In some aspects of the subject disclosure, the integers N and X can have the same value (e.g., eight, . . . ). However, the disclosure need not be limited to these aspects, and in other aspects N and X can have different values.

Wordlines 104 and bitlines 108 can form a block of memory within RRAM array 102 (which can also be referred to herein as a group of memory, a memory group, a memory block, or the like), which can be activated or deactivated by a select line SL 106. In some aspects, the block of memory can have a RRAM cell positioned at an intersection of some or all wordlines 104 and bitlines 108. In particular aspects, wordlines 104 can be local wordlines, commonly activated by one or more transistors connected to a global wordline (e.g., see FIG. 2, infra, at 206, 210 and 212). In this case, RRAM cells can instead be positioned at an intersection of subsets of local wordlines 104 and bitlines 108. Although a single set of wordlines 104 and set of bitlines 108 is depicted for RRAM array 102, it should be appreciated that RRAM array 102 can instead comprise multiple blocks of memory, including multiple sets of wordlines 104 and multiple sets of bitlines 108. Likewise, respective ones of the blocks of memory can be activated or deactivated by respective ones of multiple select lines SL 106.

Memory operations of memory architecture 100 (e.g., a read operation, a write operation, an erase operation, . . . ) can be directed toward a single block of memory at a given time, or in some aspects, one or more operations directed toward different blocks of memory can be implemented concurrently. For instance, in at least one aspect, a read operation (or multiple read operations) could be implemented for a bitline of a block of memory (e.g., in an I/O based array, see FIG. 8, infra). In other aspects, a read operation can be directed toward a subset of bitlines 108 of a single block of memory. In still other aspects, multiple respective read operations can target multiple respective subsets of bitlines of one or more blocks of memory.

RRAM array 102 can be selectively connected to or isolated from a YMUX circuit 110. YMUX circuit 110 can be configured to selectively connect or disconnect subsets of bitlines 108 with a dynamic biasing sense amplifier 114. This can be accomplished through sets of switches 112. Switches 112 can include a set of Y select switches comprising switches 0 to X for each of bitlines 108 (depicted as $Y_{SEL<X:0>}$), and a set of Y selectB switches, also comprising switches 0 to X for each of bitlines 108 (depicted as $Y_{SEL\_B<X:0>}$). Switches 112 can serve to dynamically connect or isolate subsets of bitlines 108 with an I/O contact(s) 116A or $V_{BIAS}$ contact(s) 118A related to dynamic biasing sense amplifier 114 (e.g., see FIG. 6, infra, for one example circuit implementation of YMUX 110).

Dynamic biasing sense amplifier(s) 114 can comprise a set of I/O connects 116B (having a shared set of contacts at I/O connects 116A of YMUX circuit 110) as well as one or more $V_{BIAS}$ contacts 118B (having shared contacts at $V_{BIAS}$ 118A of YMUX circuit 110). According to particular aspects of the subject disclosure, $V_{BIAS}$ 118B can be generated from a voltage observed at a target one of bitlines 108 and relayed to YMUX circuit 110 at $V_{BIAS}$ contact 118A. As such, $V_{BIAS}$ 118B can dynamically mimic changes in the observed voltage of the target bitline. Utilizing switches 112, this dynamically mimicked $V_{BIAS}$ 118B can be connected from $V_{BIAS}$ contact 118A to a subset of bitlines 108; or more specifically, to non-selected ones of bitlines 108. Thus, $V_{BIAS}$ 118B can be utilized to drive the non-selected ones of bitlines 108, thereby mitigating voltage differences between the target bitline and the non-selected bitlines. As described above, this can in turn mitigate sneak path currents within RRAM array 102 caused by such voltage differences.

Upon connecting non-selected ones of bitlines 108 to $V_{BIAS}$ contact 118A, YMUX circuit 110 can then connect dynamic biasing sense amplifier 114 to RRAM array 102. A pre-charge signal 120 can be applied at one or more of bitlines 108 (or wordlines 104, in some aspects of the subject disclosure) to facilitate a memory operation on RRAM array 102. For a read operation directed toward the above-mentioned selected RRAM cell, a bitline read voltage $V_{BL\_READ}$ 122 can be applied to the target bitline associated with this selected RRAM cell. If activated (e.g., programmed), a relatively high read current will flow through the selected programmed RRAM cell. If deactivated (e.g., erased) a relatively low read current will instead flow through the selected erased RRAM cell. YMUX circuit 110 can connect I/O contact 116B of dynamic biasing sense amplifier 114 to a read path of selected RRAM cell (through I/O contact 116A) to sense or measure a magnitude of current at the selected RRAM cell in response to read voltage $V_{BL\_READ}$ 122 being applied at the target bitline. A suitable reference current $I_{REF}$ 124 can be chosen to delineate the erased cell read current from the programmed cell read current. Thus, by measuring the current at the selected RRAM cell via I/O contact 116A and I/O contact 116B, and comparing the measured current to $I_{REF}$ 124, dynamic biasing sense amplifier 114 can determine whether the selected RRAM cell is activated or deactivated, thereby reading the cell. Furthermore, measuring the current of the selected RRAM cell can be done with relatively little or no sneak path current, because $V_{BIAS}$ 118B and YMUX circuit 110 can dynamically drive non-selected ones of bitlines 108 at a voltage observed by the target bitline. This can render a read operation more efficient and effective, and can improve sensing margin of dynamic biasing sense amplifier 114, providing a significant advantage over conventional memory operations suffering from un-mitigated sneak path currents.

Figure 2:
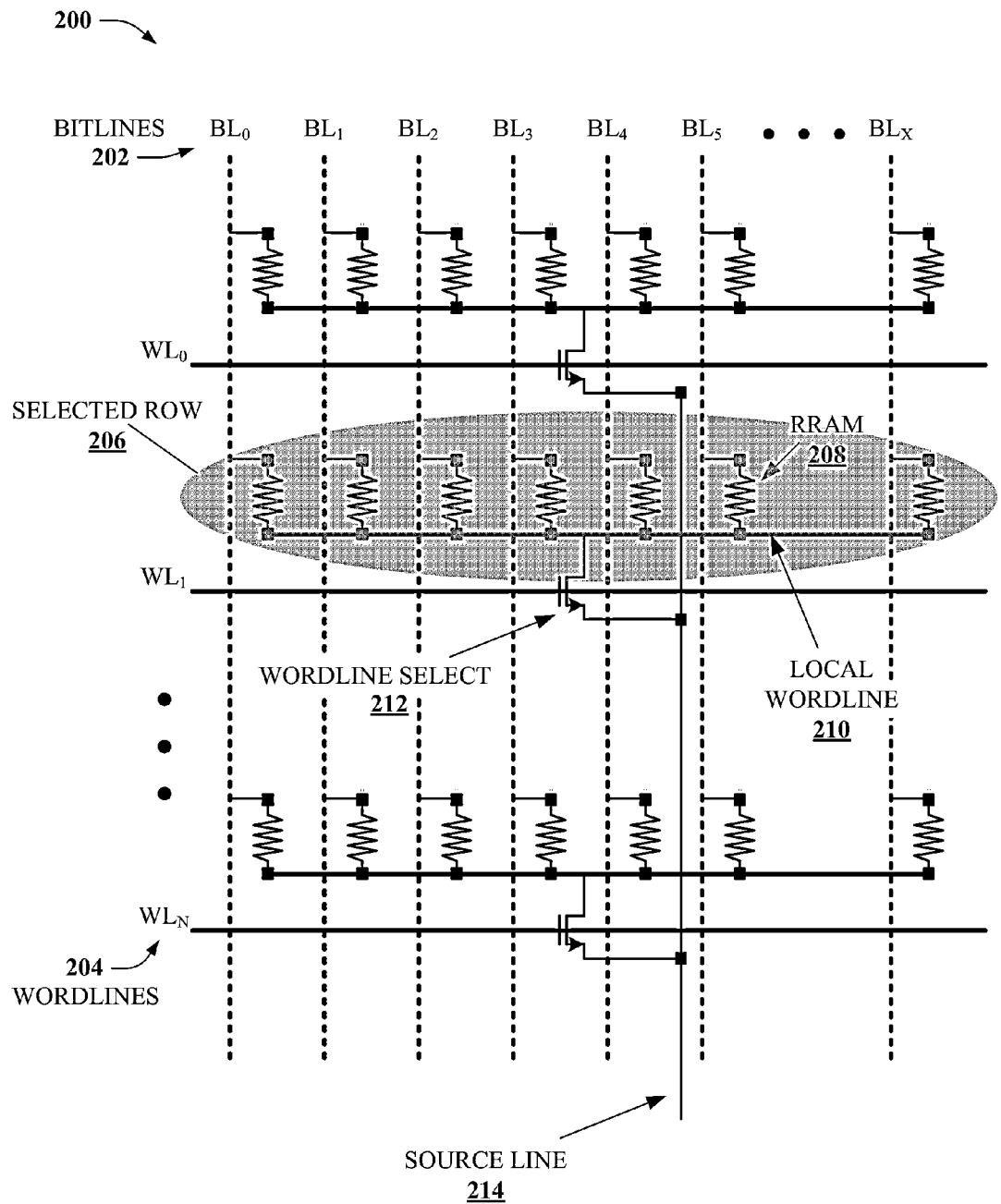
FIG. 2 depicts a circuit diagram of a sample resistive random access memory (RRAM) array architecture according to one or more aspects.

FIG. 2 illustrates a circuit diagram of an example memory block 200 according to particular aspects of the subject disclosure. Memory block 200 can be a block of RRAM memory cells, as depicted by resistive elements. Although not depicted in memory block 200, in alternative aspects of the subject disclosure one or more of the RRAM memory cells can be a non-linear resistive cell (e.g., represented by a resistive element in series with a diode element). These non-linear resistive cells can have much lower reverse current as compared with forward current. The subject disclosure is not limited to the depicted aspects or the alternative aspects of the subject disclosure, and instead can comprise still other examples of RRAM memory cells aside from basic resistive elements or non-linear resistive memory cells, as is known in the art or made known to one of skill in the art by way of the context provided herein.

Memory block 200 comprises a set of bitlines 202 intersected by a set of wordlines 204. Note that individual RRAM cells 208 of memory block 200 are not located at intersections of respective bitlines 202 and wordlines 204. Rather, a set of local wordlines, including local wordline 210, provide a common contact for respective RRAM cells 208 of a row of RRAM cells 208 of memory block 200. Thus, a selected row 206 indicated by the shaded oval comprises a set of X RRAM cells 208, connected at respective first contacts thereof to respective ones of bitlines 202, and connected at respective second contacts thereof to local wordline 210. Selection of selected row 206 can be accomplished via an associated wordline $WL_1$ (which can also be referred to as a global wordline, spanning multiple memory blocks 200) and a wordline select transistor 212, and a source line 214. By applying a select signal at $WL_1$ optionally in conjunction with a suitable bias voltage at source line 214, wordline select transistor 212 can be activated, thereby connecting RRAM cells 208 of selected row 206 to a corresponding sensing bitline(s) (not depicted). Meanwhile, wordlines $WL_0$ through $WL_N$ can be biased at a low voltage or inhibit voltage (or can float), thereby deactivating corresponding select transistors associated with these wordlines.

Application of a read voltage to a target bitline of bitlines 202 can serve to select an associated RRAM cell 208 (connected to the target bitline) of selected row 206 for a read operation. Particularly, in the event that the read voltage is applied to $BL_5$, then the depicted RRAM cell 208 of selected row 206 that is connected at its first contact to $BL_5$ will effectively be selected for the read operation. With $WL_1$ driven at a select voltage (e.g., high signal), wordline select transistor 212 is activated, thereby connecting RRAM cell 208 to source line 214. If RRAM cell 208 is in an activated state permitting a relatively large read current (e.g., programmed), this large read current will flow to sensing path 214 in response to application of the read voltage at $BL_5$. If, on the other hand, RRAM cell 208 is in a deactivated state only permitting a relatively low erase current (e.g., erased state, deprogrammed state, . . . ), this relatively low erase current will instead flow to sensing patch 214 in response to application of the read voltage at $BL_5$. By measuring the relatively large read current or the relatively low erase current at sensing path 214, a state of RRAM cell 208 can be determined.

The particular arrangement of memory block 200 provides high performance high density RRAM memory cells 208, but also can generate sneak path currents along bitlines 202 and local wordlines 210. Particularly, if a voltage difference is observed between subsets of bitlines 202, sneak path currents can flow at local wordline 210 between respective bitlines 202 (e.g., see FIG. 3, infra). These sneak path currents can distort the read current or erase current of a selected RRAM cell 208. This distortion in turn reduces sensing margin at sensing path 214, worsening efficacy of read operations of memory block 200. Accordingly, techniques for mitigating sneak path current can significantly improve these read operations as compared with memory systems that do not have reliable mechanisms to mitigate sneak path currents.

Figure 3A:
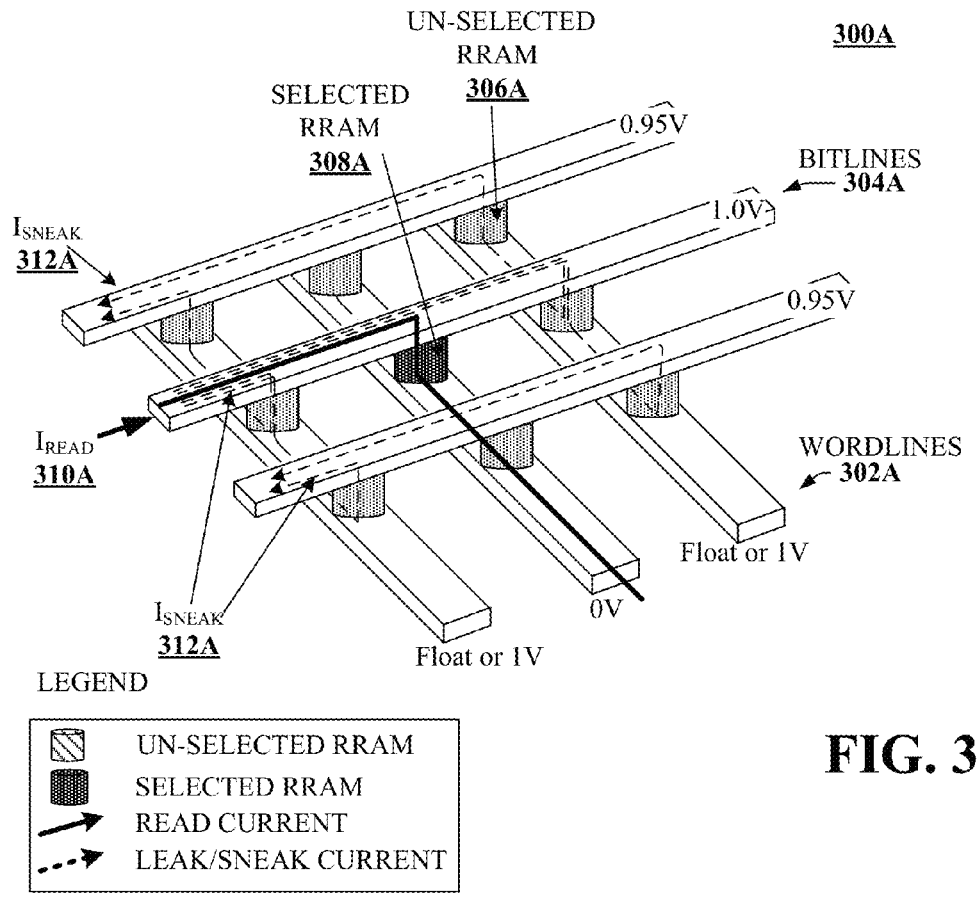
FIGS. 3A and 3B depict diagrams of an example RRAM circuit comprising sneak path currents according to further aspects.

FIG. 3A illustrates a diagram of an example memory architecture 300A experiencing sneak path currents according to one or more aspects of the subject disclosure. Memory architecture 300A comprises a cross-point array, having intersecting wordlines 302A and bitlines 304A. At each intersection of a wordline 302A and a bitline 304A is an RRAM memory cell. Lightly shaded RRAM memory cells are un-selected RRAM cells 306A, whereas the darkly shaded RRAM memory cell is a selected RRAM cell 308A. Particularly, selected RRAM cell 308 is selected for a read operation in the diagram of FIG. 3A.

For the example memory architecture 300A of FIG. 3A, different wordlines 302A observe different small differences in voltage (e.g., because the program pattern in the array is different). For instance, the middle wordline connected to selected RRAM memory cell 308A experiences 1.0 volts, whereas the top and bottom wordlines connected only to un-selected RRAM memory cells 306A experience 0.95 volts. This difference of 50 millivolts can result in several sneak path currents 312A throughout memory architecture 300A, depicted by the dashed lines.

As described herein, a read operation generally involves measuring or sensing a magnitude of a current flowing through a selected memory cell in response to application of a read voltage to that selected memory cell. As depicted in FIG. 3A, a read current, $I_{READ}$ 310A is depicted by the bold line, following a read path through the middle of wordlines 302A, through selected RRAM memory cell 308A, and finally out the middle of bitlines 304A. However, a magnitude of $I_{READ}$ 310A will add with other currents along the read path, including the sneak path currents 312A (depicted by the dashed lines). Thus, sneak path currents along wordlines 302A and bitlines 304A can add to (or subtract from, depending on polarity) the magnitude of IREAD 310A, distorting its value. For instance, if the net effect of the sneak currents is to increase a 10 microamp $I_{READ}$ 310A to 15 microamps, a loss of 5 microamps of sensing margin is observed at memory architecture 300A. This can negatively impact data integrity and performance of the read operations of RRAM cells of memory architecture 300A. However, if the voltage differences experiences by wordlines 302A or bitlines 304A can be significantly reduced, the magnitudes of these sneak path currents can likewise be significantly reduced, thereby restoring a substantial part of the data integrity and performance of the read operation. Particular aspects for reducing sneak path currents are described throughout the subject disclosure. These aspects can be implemented separately, for some improvement, or in various suitable combinations, for synergistic improvement, significantly alleviating the problems depicted by sneak path currents 312A of memory architecture 300A or similar memory architectures.

Figure 3B:
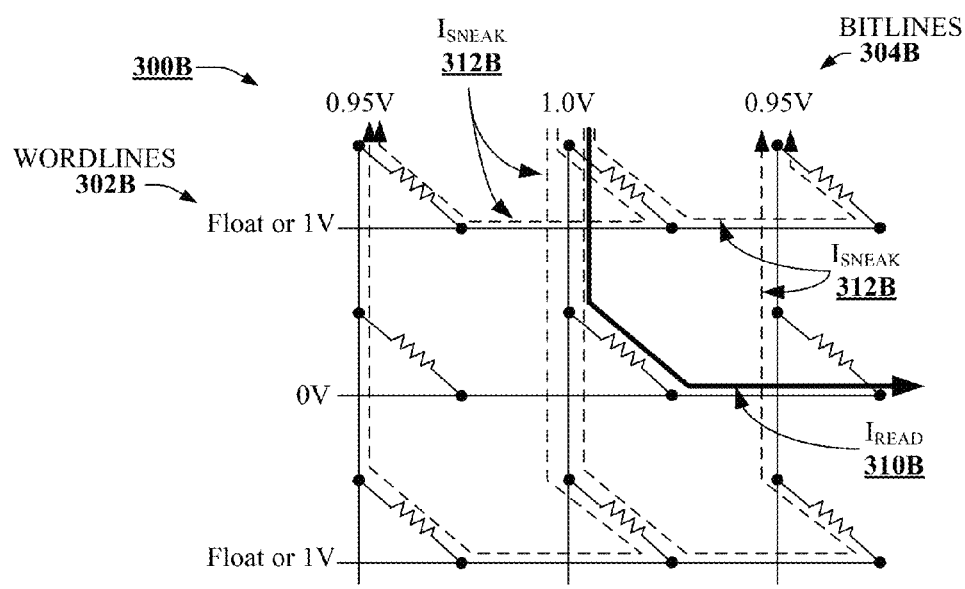

FIG. 3B illustrates a schematic view 300B of memory architecture 300A to illustrate the paths of sneak currents and read currents. A set of wordlines 302B intersect a set of bitlines 304B, with RRAM elements interconnecting respective intersections of respectives ones of the set of wordlines 302B and respective ones of the set of bitlines 304B. Read current 310B depicted by a solid arrow flows down a middle one of set of bitlines 304B and out a middle one of set of wordlines 302B. Sneak path currents 312B are depicted by dotted lines. Sneak path currents 312B have current paths from the middle of the set of bitlines 304B to the remaining ones of the set of bitlines 304B, via the outside ones of the set of wordlines 302B. By sharing a path with read current 310B along the middle one of the set of bitlines 304B, the sneak path currents 312B can affect a magnitude of read current 310B, distorting measurements of read current 310B and reducing sensing margin. By diminishing sneak path currents 312B, the distortion of read current 310B can be reduced or avoided.

Figure 4:
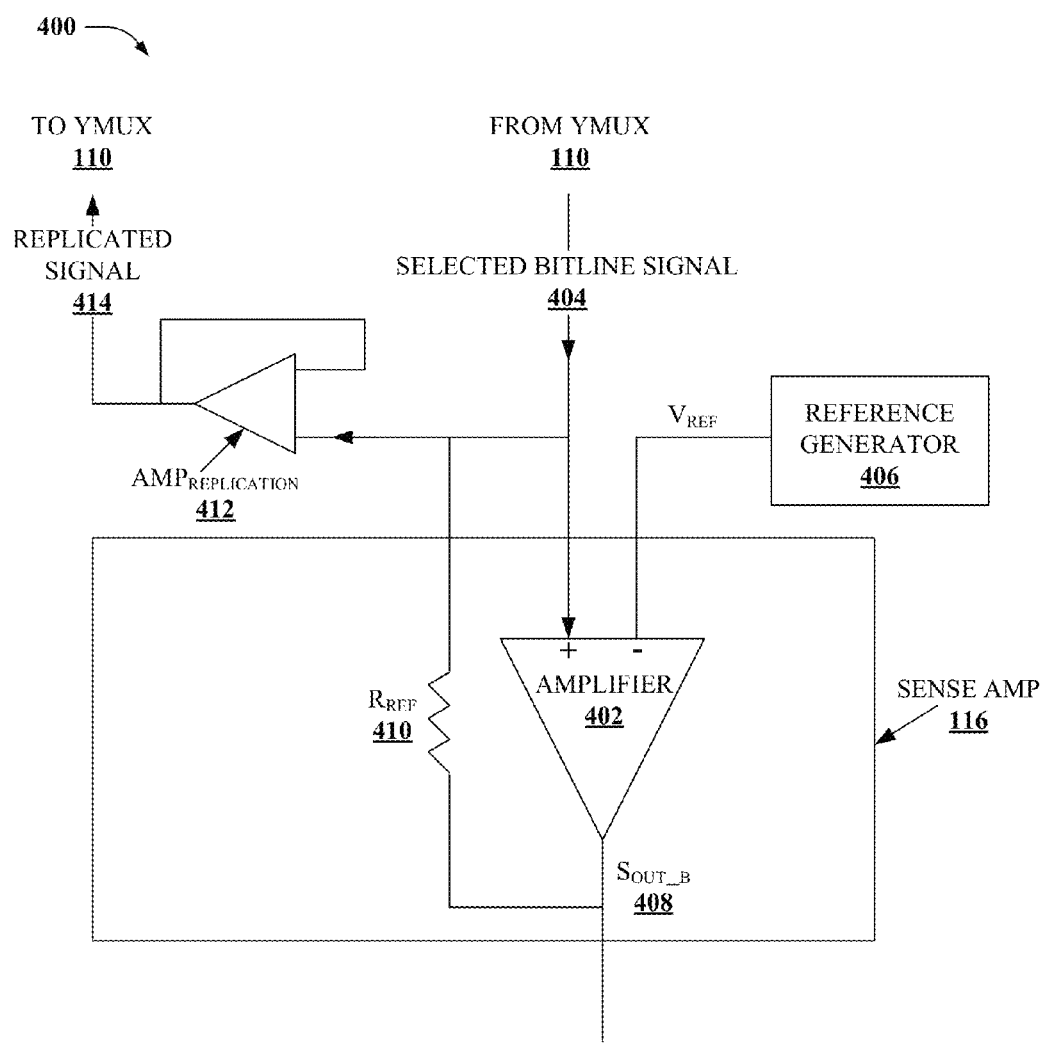
FIG. 4 depicts a circuit diagram of an example circuit configured to mitigate or avoid sneak current in an RRAM array according to particular aspects.

FIG. 4 depicts a circuit diagram of an example sensing circuit 400 that facilitates reduction of sneak path currents in electronic memory, according to one or more particular aspects of the subject disclosure. Sensing circuit 400 can comprise a sense amplifier 116, which can be substantially similar to sense amplifier 114 of FIG. 1 (including at least a subset of the features of sense amplifier 114 of FIG. 1). However, it should be appreciated that sense amplifier 116 can include additional features as described below. Sense amplifier 116 is connected to a YMUX circuit 110, which can be substantially similar to YMUX circuit 110 of FIG. 1. As depicted, YMUX circuit 110 provides a selected bitline signal 404 as an input to sense amplifier 116. Additionally, a reference generator 406 generates a reference voltage $V_{REF}$ which serves as a second input to sense amplifier 116.

Sense amplifier 116 can comprise an amplifier circuit 402. Amplifier circuit 402 includes at least two inputs, as depicted, a + input (non-inverting input) and a minus input (inverting input). Selected bitline signal 404 is provided to the non-inverting input, with the reference voltage being provided to the inverting input. An output of amplifier 402 $S_{OUT\_B}$ 408 is fed back through a reference resistor $R_{REF}$ 410 to the selected non-inverting input of amplifier 402.

Additionally, selected bitline signal 404 and the $R_{REF}$ 410 feedback are input to a replication amplifier 412. Replication amplifier outputs a replication signal 414 that dynamically mimics the selected bitline voltage 404. This replication signal 414 is provided back to YMUX circuit 110. Accordingly, YMUX circuit 110 can be configured to drive non-selected bitlines with replicated signal 414, to reduce or eliminate voltage differences between the selected bitline and the non-selected bitlines, thereby mitigating or avoiding sneak path currents caused by these voltage differences.

Figure 5:
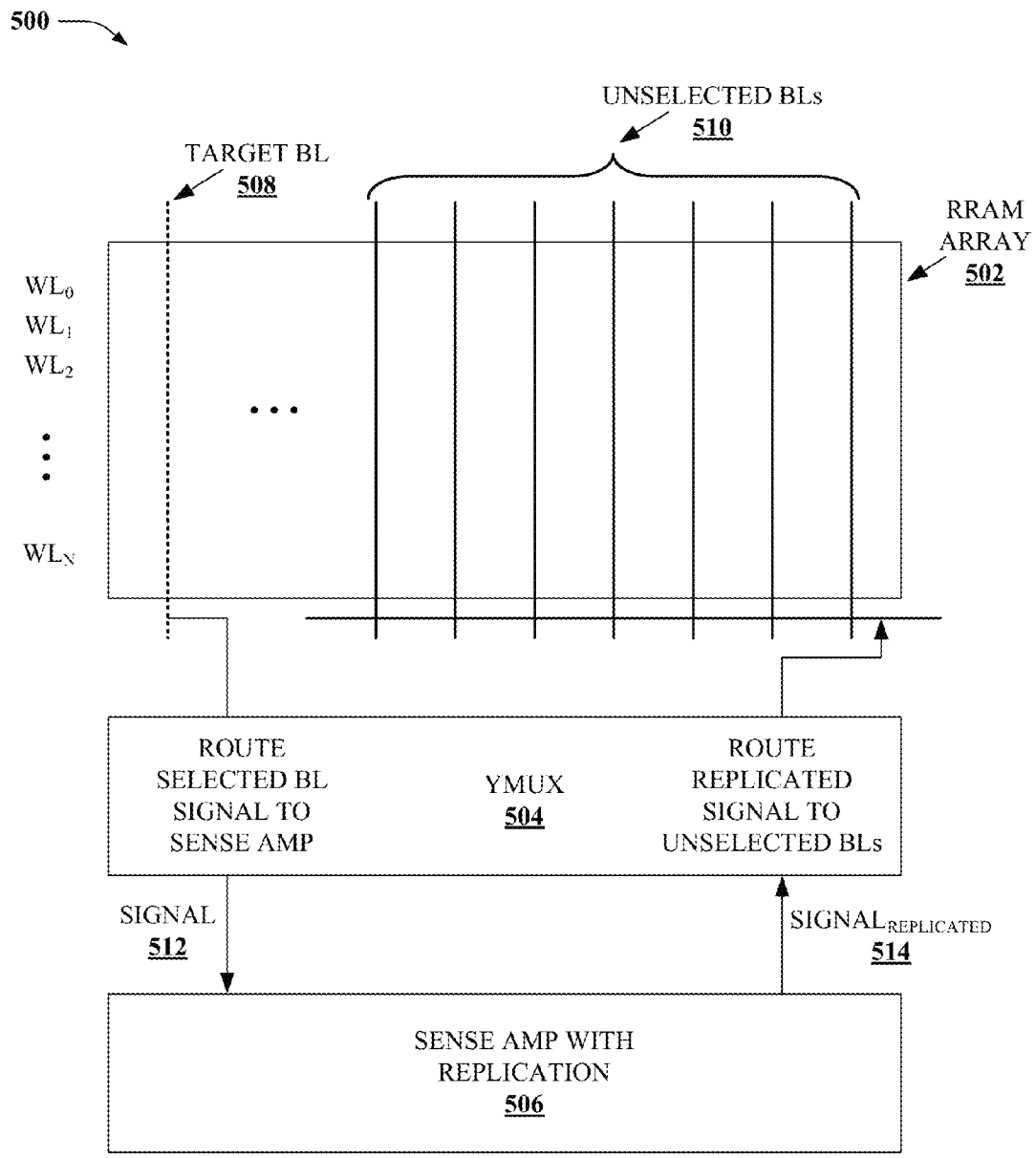
FIG. 5 illustrates a block diagram of an example RRAM architecture comprising a circuit for mitigating or avoiding sneak path currents.

FIG. 5 depicts a block diagram of an example memory architecture 500 according to alternative or additional aspects of the subject disclosure. Memory architecture 500 can comprise an RRAM array 502. In at least one aspect, RRAM array 502 can be substantially similar to RRAM array 102 of FIG. 1, although the subject disclosure is not limited to this aspect(s). As depicted, RRAM array 502 can comprise a set of wordlines, including wordlines $WL_0$, $WL_1$, $WL_2$, ..., $WL_N$. Additionally, RRAM array 502 can comprise a set of bitlines, including a target bitline(s) 508 and a set of un-selected bitlines 510. Depending on a type of memory operation employed and a particular architectural implementation of RRAM array 502, more than one target bitline 508 can be activated or selected for a given memory operation (e.g., see FIG. 8, infra). While the following description will refer to target bitline 508 in the singular, it is intended to include implementations having multiple target bitlines as is known in the art or made known to one of skill in the art by way of the context provided herein.

RRAM array 502 can be selectively connected to or electrically isolated from a YMUX 504. YMUX 504 can be substantially similar to YMUX circuit 110 in some aspects of the subject disclosure, although in other aspects YMUX 504 and YMUX circuit 110 can share a subset of common features, while having one or more additional features unique to one or another device. In at least one aspect, YMUX 504 can be substantially similar to YMUX circuit 600 of FIG. 6, infra.

YMUX 504 is configured to receive and route a voltage signal 512 of target bitline 508 to a sense amp 506. Changes in the voltage of target bitline 508 (e.g., due to activation of target bitline 508, application of a read voltage, change in current flow through target bitline 508, ...) can be reflected in voltage signal 512 as well. Sense amp 506 can comprise a signal replication circuit that mimics dynamic changes in voltage signal 512 (and the voltage of target bitline 508) and outputs a replicated signal 514 associated therewith. Particularly, replicated signal 514 can be generated to dynamically reflect changes that might occur in the voltage of target bitline 508. Replicated signal 514 is provided as an input to YMUX 504.

Upon receiving replicated signal 514, YMUX 504 can be configured to selectively connect replicated signal 514 to a subset of the bitlines of RRAM array 502. For instance, YMUX 504 can be configured to connect replicated signal 514 to respective ones of unselected bitlines 510, and isolate replicated signal 514 from target bitline 508, in at least one aspect. Alternatively, or in addition, YMUX 504 can be configured to connect replicated signal 514 to a subset of unselected bitlines 510. This subset can comprise, for instance, bitlines immediately adjacent to target bitline 508, bitlines that are removed from target bitline 508 by a predetermined number of bitlines or fewer, or bitlines experiencing a voltage difference with respect to target bitline 508 that rises above a predetermined magnitude, or the like, or a suitable combination thereof.

Upon connecting replicated signal 514 to the subset of the bitlines of RRAM array 502, respective voltage differences between respective ones of the subset of bitlines and target bitline 508 can be reduced. This reduction in voltage difference can in turn reduce magnitude of some or all sneak path currents within RRAM array 502 (e.g., see FIG. 3, supra). In at least one aspect of the subject disclosure, utilizing a replication signal 514 to reduce sneak path current within a RRAM array 502 can be implemented in conjunction with an I/O based architecture (e.g., see FIG. 8, infra). The I/O based architecture can connect a subset of bitlines of multiple memory blocks to a given I/O connection with a sense amplifier (e.g., sense amp 506, ...). In this manner, other bitlines of a given memory block can be isolated from the I/O connection, mitigating effects of sneak path currents generated by these other bitlines, at least as observed by the sense amp at the given I/O connection. The I/O based architecture can be employed in conjunction with driving unselected bitlines 510 with a signal that dynamically mimics voltage changes in target bitline 508, for synergistic improvements in efficiency and efficacy of read operations of a RRAM memory architecture.

Figure 6:
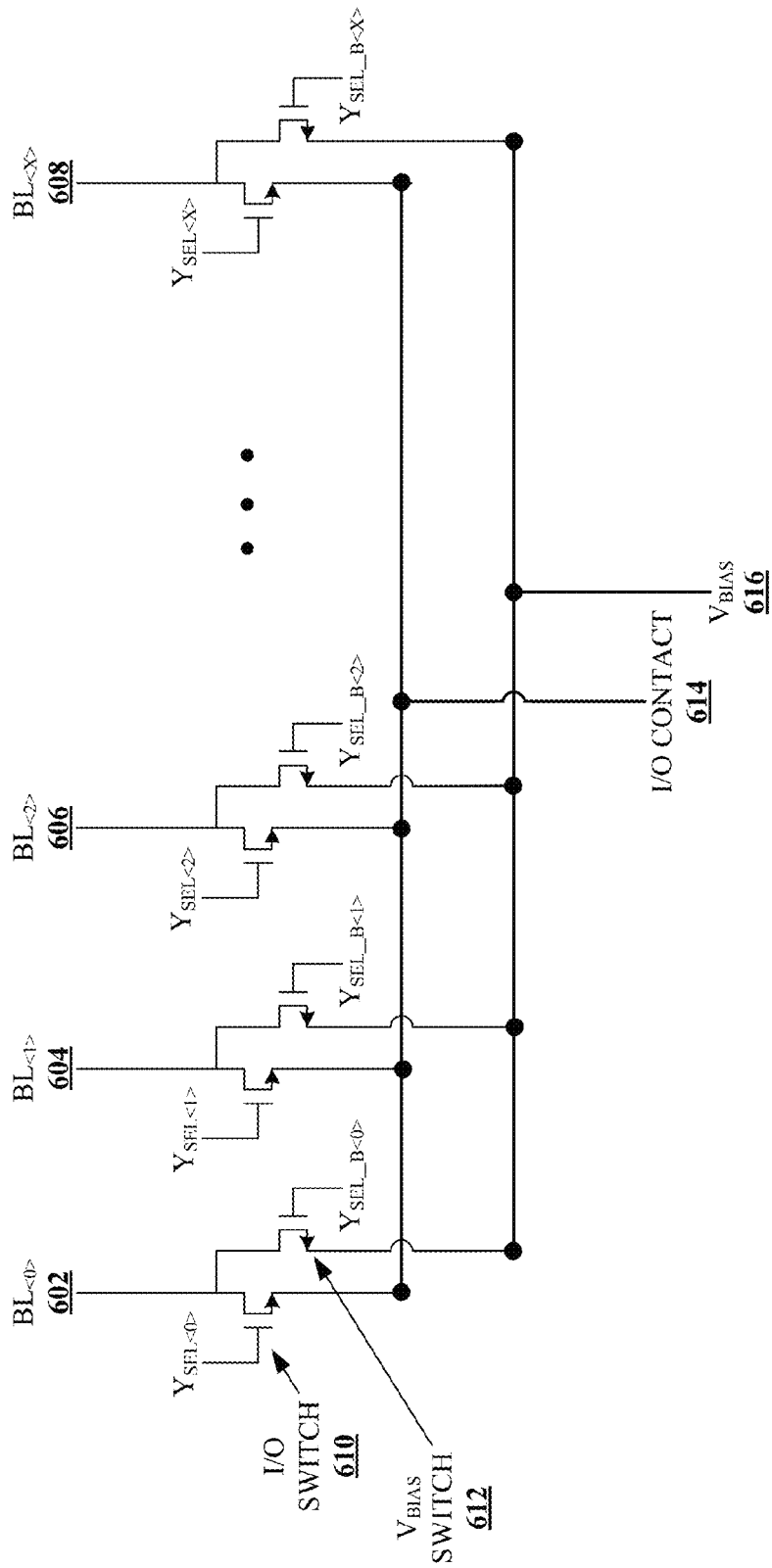
FIG. 6 depicts a circuit diagram of an example multiplexer for selective control of dynamic bias and sensing connections for an RRAM memory.

FIG. 6 illustrates a circuit diagram of an example Y-multiplexer (YMUX) 600 according to one or more particular aspects of the subject disclosure. YMUX 600 can be configured to selectively interconnect one or more bitlines of an RRAM array with a dynamic $V_{BIAS}$ signal, according to an aspect, and further can be configured to selectively interconnect one or more bitlines of the RRAM array with an I/O contact for sensing. Furthermore, it should be appreciated that a subset of the bitlines can dynamically change for different memory operations of the RRAM array. For instance, YMUX 600 can select a first subset of bitlines to connect to the $V_{BIAS}$ signal for a first memory operation, and then select a second subset of bitlines, different from the first subset of bitlines, to connect to the $V_{BIAS}$ signal for a second memory operation, and so on. Likewise, YMUX 600 can select a third subset of bitlines (different from the first subset, the second subset, ...) to connect to the I/O contact for the first memory operation, and then select a fourth subset of the bitlines (different from the first subset, the second subset, the third subset, ...) to connect to the I/O contact for the second memory operation, or the like.

YMUX 600 comprises a set of contacts with a corresponding set of bitlines of a memory array. As depicted, the set of bitline contacts can include contacts for $BL_{<0>}$ 602, $BL_{<1>}$ 604, $BL_{<2>}$ 606, ... $BL_{<X>}$ 608 (referred to collectively as bitline contacts 602-608). Each of the bitline contacts 602-608 also has an associated set of switches, including a respective I/O switch 610 and a respective $V_{BIAS}$ switch 612. Thus, $BL_{<0>}$ 602 has an associated I/O switch 610 and an associated $V_{BIAS}$ switch 612, and likewise for other bitlines of bitline contacts 602-608. Respective I/O switches 610 are activated or deactivated by respective Y select signals, including $Y_{SEL<0>}$ for an I/O switch 610 associated with $BL_{<0>}$ 602, $Y_{SEL<1>}$ for an I/O switch 610 associated with $BL_{<1>}$ 604, and so on. Activation of a particular I/O switch connects a corresponding bitline contact 602-608 with I/O contact 614. In at least some aspects of the subject disclosure, I/O contact 614 can be connected to a sense amplifier (e.g., the non-inverting input of amplifier 402 of sense amp 116 of FIG. 4, supra) for sensing a signal at one or more of bitline contacts 602-608, for instance. In addition to the foregoing, respective $V_{BIAS}$ switches 612 are activated or deactivated by respective Y select_B signals, including $Y_{SEL\_B<0>}$ for a $V_{BIAS}$ switch 612 associated with $BL_{<0>}$ 602, $Y_{SEL\_B<1>}$ for a $V_{BIAS}$ switch 612 associated with $BL_{<1>}$, and so on. Activation of a particular $V_{BIAS}$ switch connects a corresponding bitline contact 602-608 with $V_{BIAS}$ signal 616.

In operation, YMUX 600 can selectively connect a subset of bitline contacts 602-608 to $V_{BIAS}$ signal 616, by activating corresponding Y select_B signals of the subset of bitline contacts 602-608. Other bitline contacts 602-608 can be isolated from $V_{BIAS}$ signal 616 by leaving corresponding Y select_B signals of these other bitline contacts 602-608 at low magnitude, or deactivated. Likewise, YMUX 600 can selectively connect a second subset of bitline contacts 602-608 to I/O contact 614 by selectively activating (setting to high magnitude) Y select signals of the second subset of I/O switches 610 corresponding with the second subset of bitline contacts 602-608.

The following is a particular example of operation of YMUX 600 for a read operation of a memory cell connected to $BL_{<0>}$. It should be appreciated that this example can be extended to read operations of memory cells on other bitlines, in an analogous manner of operation. Upon selection of $BL_{<0>}$ 602 for the read operation, $Y_{SEL<0>}$ can activate I/O switch 610 associated with $BL_{<0>}$ 602, thereby connecting bitline contact 602 with I/O contact 614. A voltage measurement of bitline contact 602 can be acquired (e.g., by a replication amplifier 412 of FIG. 4, supra) and applied to $V_{BIAS}$ contact 616. In addition, YMUX 600 can activate $Y_{SEL\_B<1>}$ associated with $BL_{<1>}$ 604, $Y_{SEL\_B<2>}$ associated with $BL_{<2>}$ 606, . . . through $Y_{SEL\_B<X>}$ associated with $BL_{<X>}$ 608, thereby connecting bitline contacts 604-608 to $V_{BIAS}$ signal 616, to drive bitline contacts 604-608 with the voltage measurement of bitline contact 602, mitigating voltage differences between bitline contact 602 and respective ones of bitline contacts 604-608. This can effectively reduce sneak path currents of the memory array associated with bitline contacts 602-608, as described herein.

Figure 7:
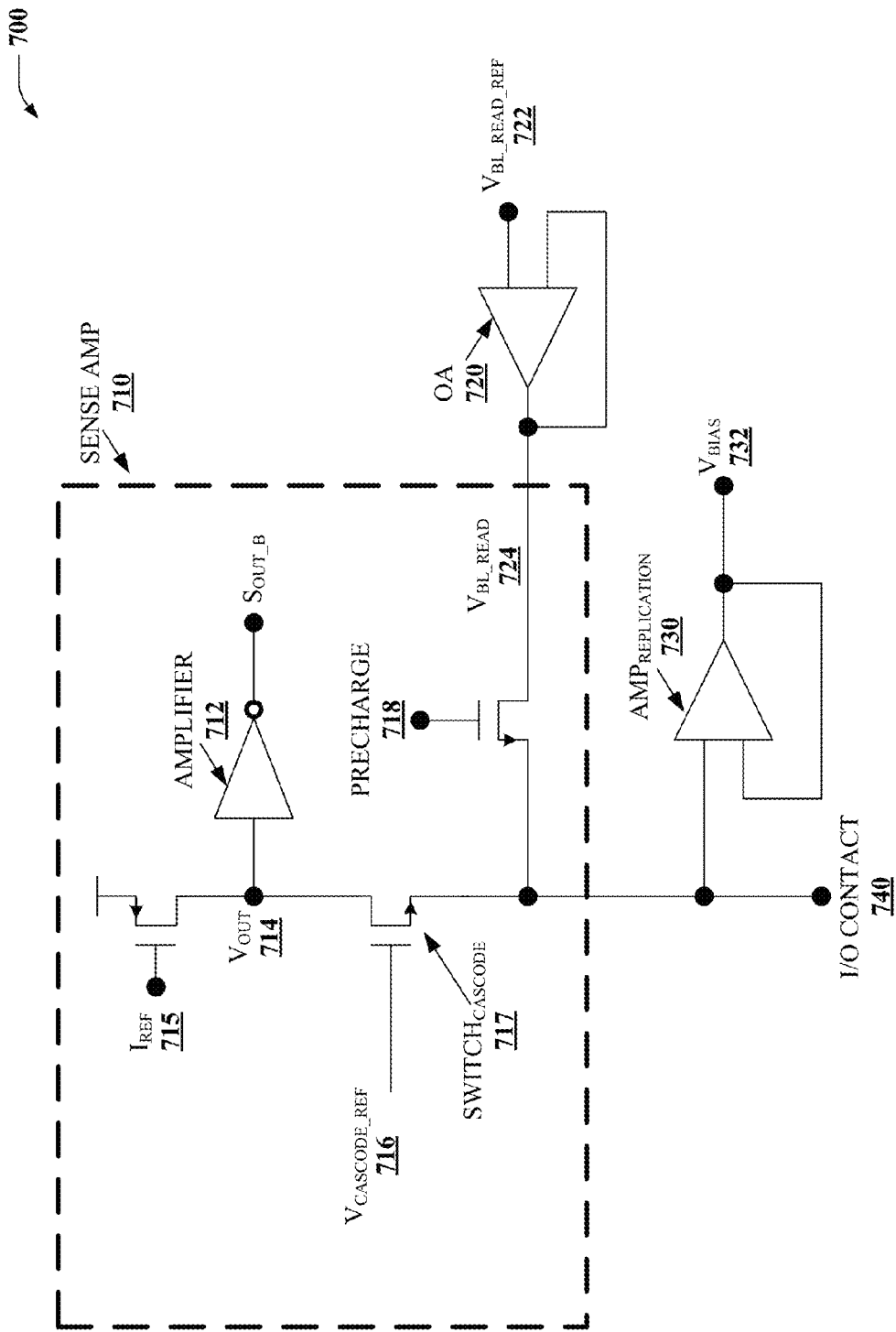
FIG. 7 illustrates a circuit diagram of an example sense amplifier according to one or more additional aspects of the subject disclosure.

FIG. 7 depicts a circuit diagram of an example sensing circuit 700 for reading selected cells of an RRAM array, according to one or more additional aspects of the subject disclosure. Sensing circuit 700 can comprise a sense amplifier 710, delineated by the bold dashed rectangle, connected with a replication amplifier 730 and an operational amplifier OA 720. Respective amplifier circuits perform different functions in conjunction with a memory array, as described below.

Sense amplifier 710 can comprise an amplifier 712 that receives a voltage $V_{OUT}$ 714 as an input, and that outputs a signal $S_{OUT\_B}$. Particularly, $S_{OUT\_B}$ can be indicative of a state of a measured memory cell, such as an RRAM cell. $V_{OUT}$ 714 can be a voltage provided by I/O contact 740 in conjunction with a bitline read voltage $V_{BL\_READ}$ 724 output by OA 720. A pre-charge signal 718 can be applied to a pre-charge switch to selectively connect or isolate $V_{BL\_READ}$ 724 from an input of amplifier 712. Likewise, a signal $V_{CASCODE\_REF}$ 716 can activate or deactivate a switch$_{CASCODE}$ 717 that connects or isolates the input of amplifier 712 from I/O contact 740 and the pre-charge switch 718 as depicted. $V_{CASCODE\_REF}$ 716 sets the bitline voltage approximately at $V_{CASCODE\_S} - V_T$ (where $V_T$ is the threshold of the transistor comprising switch$_{CASCODE}$ 717). Accordingly, the input of amplifier 712 as well as the constituent parts of such input can be individually controlled by different components of sense amp 710.

Also, as depicted, a reference current switch activated or deactivated by reference current $I_{REF}$ 715 can integrate a reference signal (not depicted) as a component of $V_{OUT}$ 714. $I_{REF}$ 715 can be set to delineate a read current (e.g., current of a programmed cell) from an erase current (e.g., current of an erased cell) of a selected memory cell in response to application of the bitline read voltage $V_{BL\_READ}$ 722 to a bitline associated with the selected memory cell. When sensing a programmed cell, current of the cell $>I_{REF}$ and $S_{OUT\_B}$ has a relatively high magnitude. On the other hand, when sensing an erased cell, current of the cell $<I_{REF}$ and consequently $S_{OUT\_B}$ has a relatively low magnitude (e.g., approximately zero, or approaching zero).

OA 720 provides the bitline read voltage $V_{BL\_READ}$ 724 for sense amp 710. The bitline read voltage can be based on a bitline reference voltage $V_{BL\_READ\_REF}$ 722 input to OA 720. In some aspects of the subject disclosure, $V_{BL\_READ}$ 722 can be a voltage applied to a target bitline for sensing a memory cell connected to the target bitline (e.g., see FIG. 2, supra).

Replication amplifier 730 can be employed to replicate a signal at I/O contact 740 and output the replicated signal as a bias voltage $V_{BIAS}$ 732. $V_{BIAS}$ 732 can in turn be utilized to drive non-selected bitlines of a memory cell to mitigate voltage differences among bitlines of the memory cell, as described herein.

An example read operation pertaining to a selected RRAM cell of an RRAM memory device is described below. It should be appreciated that the example read operation is not intended to be exclusive, and other read operations known in the art or made known to one of ordinary skill in the art by way of the context provided herein are intended to be included within the scope of the subject disclosure. Particularly, the read operation comprises a pre-charge operation followed by a sensing operation. The pre-charge operation can comprise a voltage $V_{dd}$ applied to pre-charge contact 718 and to a wordline select contact (e.g., see FIG. 2, supra) of an RRAM memory array. Un-selected wordlines can be grounded, or driven at zero volts. $I_{REF}$ 715 can be applied at a suitable reference current for delineating a read current of the selected memory cell and an erase current of the selected memory cell. Selected and unselected bitlines can be pre-charged at 1 volt, along with $V_{BL\_READ\_REF}$ 722. Furthermore, $V_{CASCODE\_REF}$ 716 can be pre-charged at the bitline read voltage $V_{BL\_READ}$ 724 plus the threshold voltage $V_t$ of the switch$_{CASCODE}$ 717 transistor. To read the selected memory cell, the sensing operation can be initiated in which the voltage at pre-charge contact 718 is changed from $V_{dd}$ to zero volts, and the selected bitline and unselected bitlines are biased at $V_{BL\_READ}$, and other signals remain the same as the pre-charge operation. According to these operations, when the selected memory cell is programmed $V_{BL\_READ}$ drops below one volt and $V_{OUT}$ follows $V_{BL\_READ}$. Consequently, $S_{OUT\_B}$ rises to $V_{dd}$. When the selected memory cell is erased, $V_{BL\_READ}$ remains approximately at one volt, $V_{OUT}$ rises toward $V_{dd}$, and $S_{OUT\_B}$ falls to approximately ground.

Figure 8:
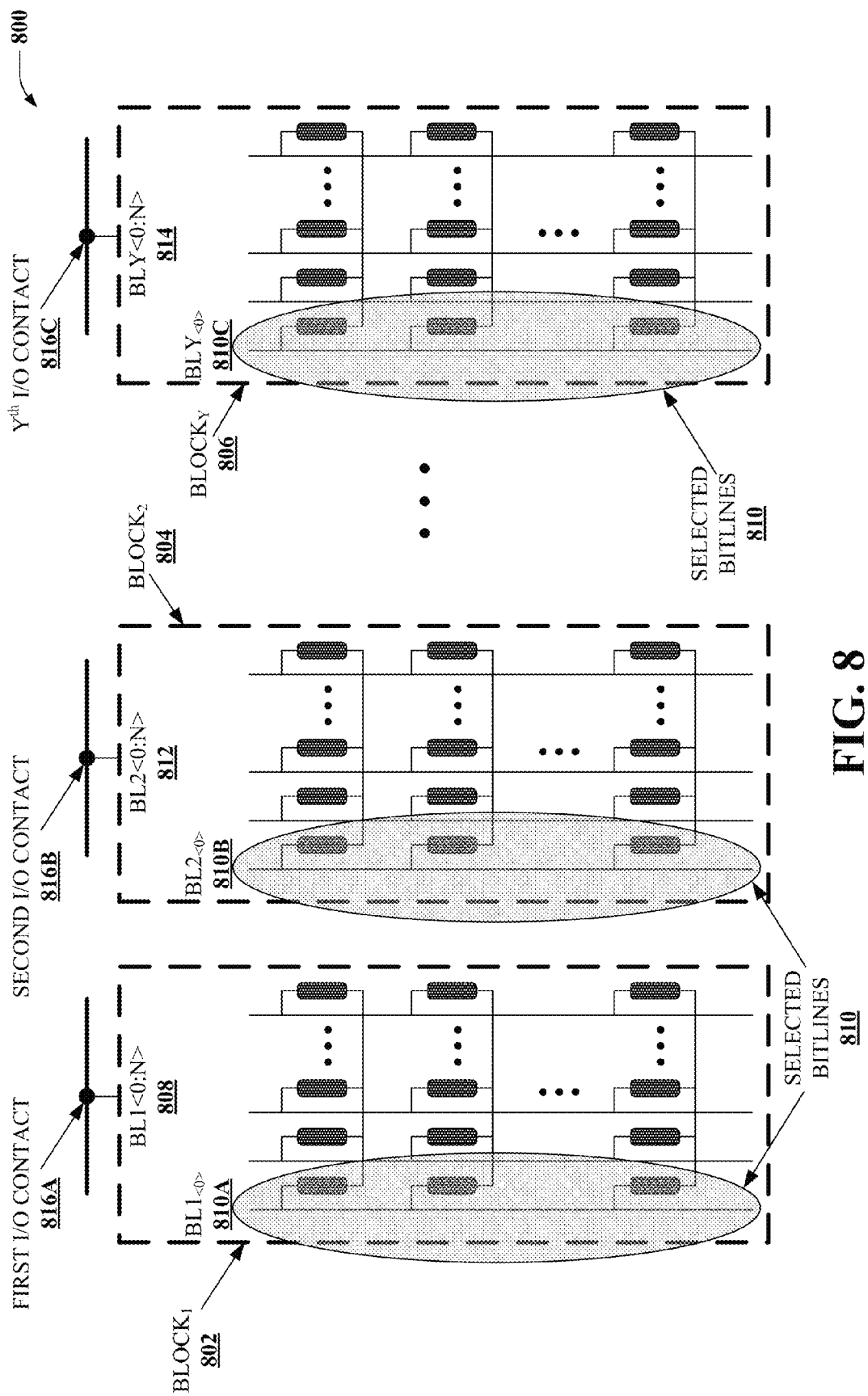
FIG. 8 depicts a diagram of an example input/output based RRAM architecture according to one or more further aspects.

FIG. 8 illustrates a diagram of an example memory architecture 800 according to one or more additional aspects of the subject disclosure. Memory architecture 800 comprises multiple blocks of RRAM memory cells, including block$_1$ 802, block$_2$ 804, . . . , block$_Y$ 806, wherein Y is a suitable positive integer greater than 1 (referred to collectively as memory blocks 802-806). Each memory block 802-806 comprises a respective set of bitlines, including $BL_1<0:N>$ 808 of block$_1$ 802, $BL_2<0:N>$ 812 of block$_2$ 804 through $BL_Y<0:N>$ 814 of block$_Y$ 806 (referred to collectively as sets of bitlines 808, 812, 814). Furthermore, memory architecture 800 can be configured as an I/O based architecture (as opposed, e.g., to a word based architecture). In the I/O based architecture depicted by FIG. 8, each bitline of the respective sets of bitlines 808, 812, 814 can be connected to a respective I/O contact (e.g., through a YMUX) of a set of I/O contacts. For instance, bitlines of set of bitlines $BL_1<0:N>$ 808 can be connected to a first I/O contact 816A. Bitlines of set of bitlines $BL_2<0:N>$ 812 can be connected to a second I/O contact 816B, and bitlines of set of bitlines $BL_Y<0:N>$ 814 can be connected to $Y^{th}$ I/O contact 816C. According to this arrangement, first bitline $BL1_{<0>}$ 810A can be activated or selected while other bitlines of $block_1$ 802 are non-selected or inhibited, to mitigate effects of voltage differences among the bitlines of $block_1$ 802 as measured at first I/O contact 816A, and likewise with other selected bitlines 810 of $block_2$ 804 and $block_Y$ 806. As described herein, voltage differences can be further reduced by driving other bitlines of $block_1$ 802 by a bias voltage that tracks a voltage of $BL1_{<0>}$ 810A, further reducing voltage differences among the bitlines of $block_1$ 802.

The aforementioned diagrams have been described with respect to interaction between several components, or memory architectures. It should be appreciated that such diagrams can include those components and architectures specified therein, some of the specified components/architectures, and/or additional components/architectures. For example, a memory cell architecture could include a combination of memory architecture 800, sensing circuit 400 and YMUX 600. Sub-components could also be implemented as electrically connected to other sub-components rather than included within a parent architecture. Additionally, it should be noted that one or more disclosed processes could be combined into a single process providing aggregate functionality. For instance, a program process can comprise an erase process, or vice versa, to facilitate programming and erasing a semiconductor cell by way of a single process. In addition, it should be appreciated that respective rows of disclosed memory architectures can be erased in groups (e.g., multiple rows erased concurrently) or individually. Moreover, it should be appreciated that multiple RRAM cells on a particular row can be programmed in groups (e.g., multiple RRAM cells programmed concurrently) or individually. Components of the disclosed architectures can also interact with one or more other components not specifically described herein but known by those of skill in the art.

Figure 9:
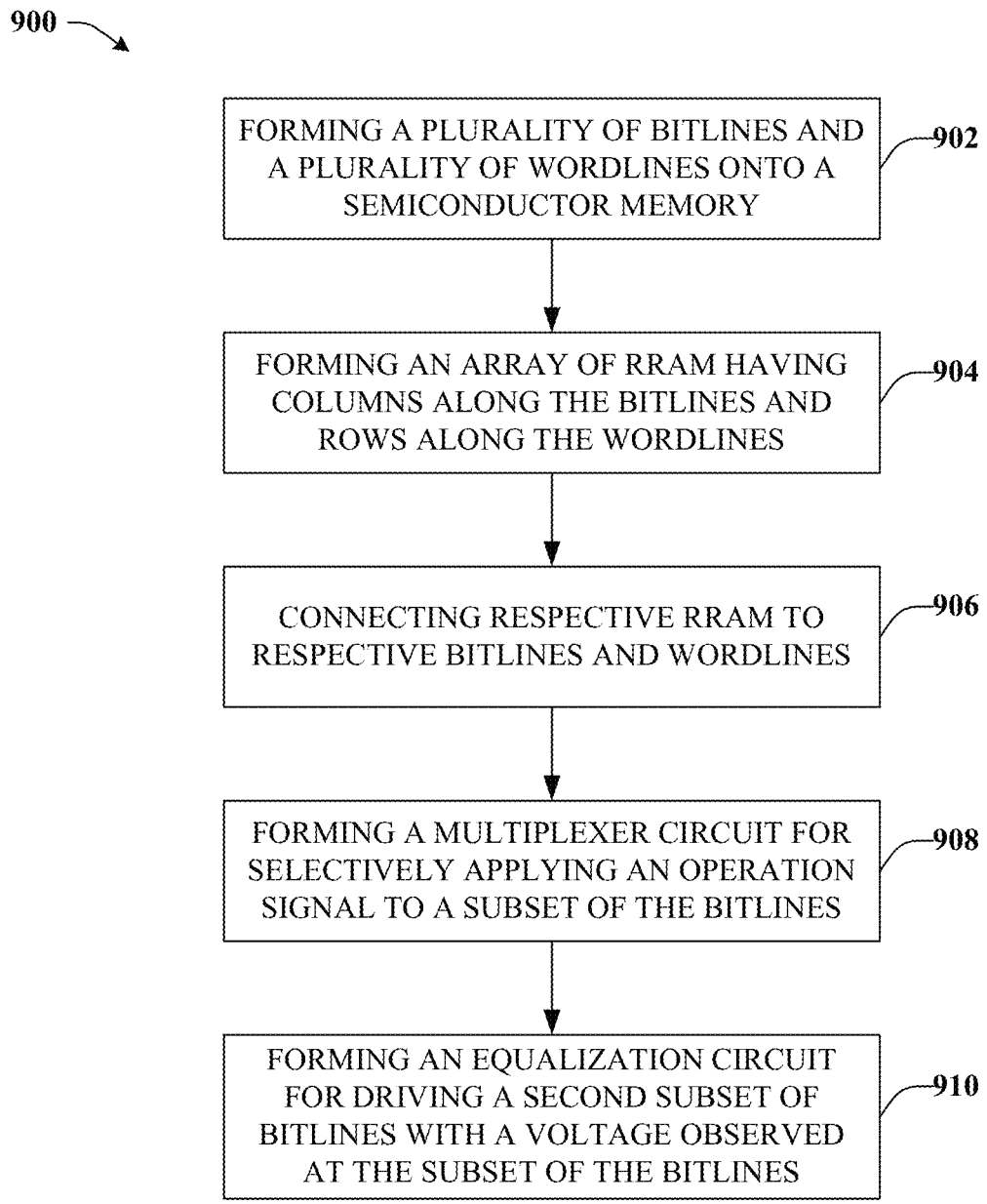
FIG. 9 illustrates a flowchart of a sample method for fabricating an RRAM array with reduced sneak path current pursuant to disclosed aspects.
Figure 10:
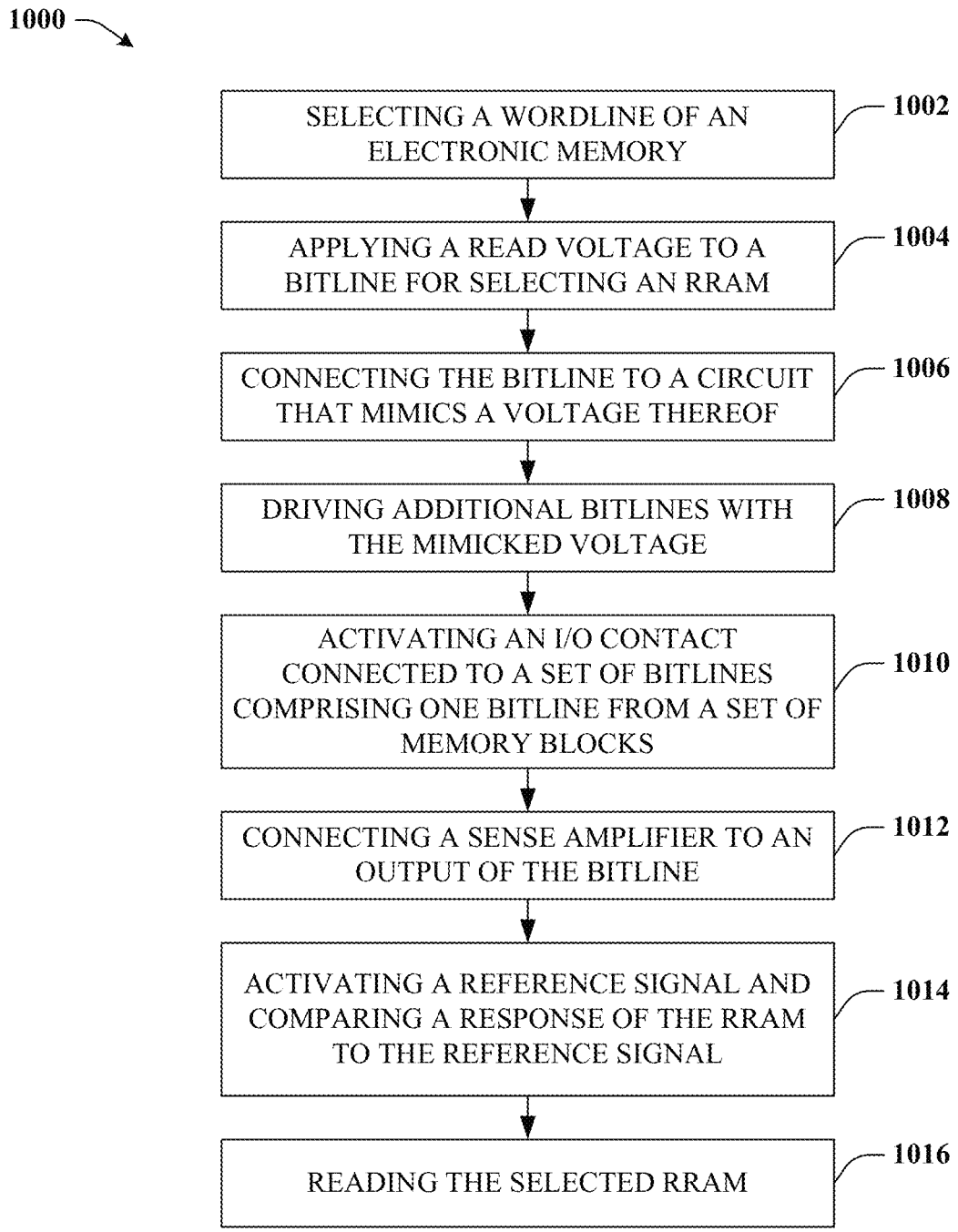
FIG. 10 depicts a flowchart of an example method for operating an RRAM memory with reduced sneak path current according to further aspects.

In view of the exemplary diagrams described supra, process methods that can be implemented in accordance with the disclosed subject matter will be better appreciated with reference to the flow charts of FIGS. 9 and 10. While for purposes of simplicity of explanation, the methods 900, 1000 are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods 900, 1000 described hereinafter. Additionally, it should be further appreciated that the methods 900, 1000 disclosed hereinafter and throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

FIG. 9 illustrates a flowchart of an example method 900 for fabricating an RRAM memory device according to one or more additional aspects of the subject disclosure. At 902, method 900 can comprise forming a plurality of bitlines and a plurality of wordlines onto a semiconductor memory device. At 904, method 900 can comprise forming an array of RRAM having columns aligned along respective ones of the plurality of bitlines and rows aligned along respective ones of the plurality of wordlines. Additionally, at 906, method 900 can comprise connecting respective first contacts of respective ones of the array of RRAM to one of the plurality of bitlines and respective second contacts of the respective ones of the array of RRAM to one of the plurality of wordlines. At 908, method 900 can comprise forming a multiplexer circuit in the semiconductor memory configured for selectively applying an operation signal at least to a subset of the plurality of bitlines. At 910, method 900 can comprise forming an equalization circuit for driving a second subset of the plurality of bitlines with an operation voltage observed at the subset of the plurality of bitlines in response to the operation signal.

In one or more other aspects, method 900 can additionally comprise forming a set of input/output contacts in the semiconductor memory that are electrically connected to respective ones of the plurality of bitlines or respective ones of the plurality of wordlines. In another aspect, method 900 can comprise forming a sensing circuit in the semiconductor memory and connecting the sensing circuit to the set of input/output contacts for measuring a state of selected RRAM of the array of RRAM. In still other aspects, forming the equalization circuit can further comprise forming an operational amplifier wherein forming the multiplexer comprises forming a bitline output lead that conveys the operation voltage as an input to the operational amplifier. In alternative, or additional aspects of the subject disclosure, method 900 can comprise forming a feedback loop that provides an output of the operational amplifier as a second input to the operational amplifier. In at least one aspect, method 900 can comprise forming respective sets of switches for respective ones of the set of bitlines for selectively applying the operation signal or the operation voltage to one or more of the set of bitlines.

Referring now to FIG. 10, there is depicted a flowchart of an example method 1000 for operating an RRAM array according to alternative or additional aspects of the subject disclosure. At 1002, method 1000 can comprise selecting a wordline of the electronic memory. At 1004, method 1000 can comprise applying a read voltage to a bitline of the electronic memory that is connected to a RRAM element selected for reading. At 1006, method 1000 can comprise connecting the bitline to a circuit that dynamically mimics an actual voltage at the bitline of the electronic memory. Moreover, method 1000 can comprise, at 1008, driving at least one additional bitline adjacent to the bitline with the actual voltage in conjunction with reading a state of the RRAM element. According to one or more particular aspects, method 1000, at 1010, can further comprise activating an input/output contact that is connected to a set of bitlines of the electronic memory, where the set of bitlines comprises at least the bitline and the one additional bitline. In further aspects, method 1000 can comprise connecting a sensing amplifier to an output of the bitline, and activating a reference signal and comparing a response of the RRAM element to the reference signal, and determining whether the response is greater than or less than the reference signal.

Figure 11:
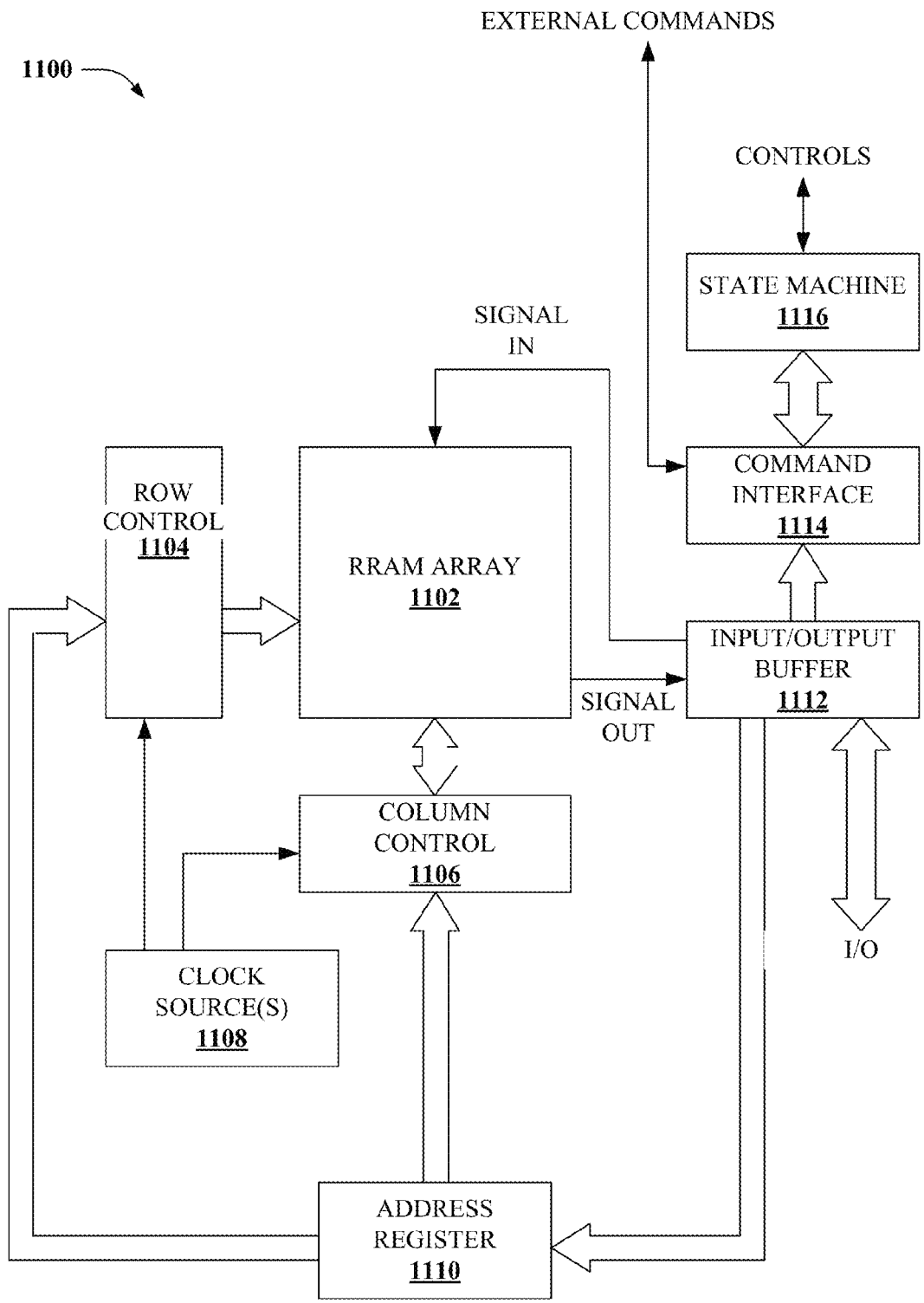
FIG. 11 illustrates a block diagram of an example electronic operating environment according to one or more additional aspects of the subject disclosure.

In order to provide a context for the various aspects of the disclosed subject matter, FIG. 11, as well as the following discussion, is intended to provide a brief, general description of a suitable environment in which various aspects of the disclosed subject matter can be implemented or processed. While the subject matter has been described above in the general context of semiconductor architectures and process methodologies for fabricating and operating such architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, hand-held computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory, or the like. In a distributed computing environment, program modules can be located in both local and remote memory storage modules or devices.

FIG. 11 illustrates a block diagram of an example operating and control environment 1100 for a RRAM array 1102 according to aspects of the subject disclosure. In at least one aspect of the subject disclosure, RRAM array 1102 can comprise a variety of RRAM memory cell technology. Particularly, RRAM array can be configured or operated to mitigate or avoid sneak path currents of the RRAM array, as described herein.

A column controller 1106 can be formed adjacent to RRAM array 1102. Moreover, column controller 1106 can be electrically coupled with bit lines of RRAM array 1102. Column controller 1106 can control respective bitlines, applying suitable program, erase or read voltages to selected bitlines.

In addition, operating and control environment 1100 can comprise a row controller 1104. Row controller 1104 can be formed adjacent to column controller 1106, and electrically connected with word lines of RRAM array 1102. Row controller 1104 can select particular rows of memory cells with a suitable selection voltage. Moreover, row controller 1104 can facilitate program, erase or read operations by applying suitable voltages at selected word lines.

A clock source(s) 1108 can provide respective clock pulses to facilitate timing for read, write, and program operations of row control 1104 and column control 1106. Clock source(s) 1108 can further facilitate selection of word lines or bit lines in response to external or internal commands received by operating and control environment 1100. An input/output buffer 1112 can be connected to an external host apparatus, such as a computer or other processing device (not depicted) by way of an I/O buffer or other I/O communication interface. Input/output buffer 1112 can be configured to receive write data, receive an erase instruction, output readout data, and receive address data and command data, as well as address data for respective instructions. Address data can be transferred to row controller 1104 and column controller 1106 by an address register 1110. In addition, input data is transmitted to RRAM array 1102 via signal input lines, and output data is received from RRAM array 1102 via signal output lines. Input data can be received from the host apparatus, and output data can be delivered to the host apparatus via the I/O buffer.

Commands received from the host apparatus can be provided to a command interface 1114. Command interface 1114 can be configured to receive external control signals from the host apparatus, and determine whether data input to the input/output buffer 1112 is write data, a command, or an address. Input commands can be transferred to a state machine 1116.

State machine 1116 can be configured to manage programming and reprogramming of RRAM array 1102. State machine 1116 receives commands from the host apparatus via input/output interface 1112 and command interface 1114, and manages read, write, erase, data input, data output, and like functionality associated with RRAM array 1102. In some aspects, state machine 1116 can send and receive acknowledgments and negative acknowledgments regarding successful receipt or execution of various commands.

To implement read, write, erase, input, output, etc., functionality, state machine 1116 can control clock source(s) 1108. Control of clock source(s) 1108 can cause output pulses configured to facilitate row controller 1104 and column controller 1106 implementing the particular functionality. Output pulses can be transferred to selected bit lines by column controller 1106, for instance, or word lines by row controller 1104, for instance.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A semiconductor memory, comprising:
 a set of two terminal memory devices;
 a set of bitline interconnects, respective ones of the set of bitline interconnects are connected to respective first terminals of respective subsets of the set of two terminal memory devices and configured to activate or deactivate respective ones of the subsets of the set of two terminal memory devices by application of a bias voltage; and
 a bias voltage replication circuit configured to dynamically track an observed voltage at a selected one of the set of bitline interconnects resulting from application of the bias voltage to the selected one of the set of bitlines, and to apply the observed voltage that is dynamically tracked to a non-selected one of the set of bitline interconnects.

2. The semiconductor memory of claim 1, wherein the bias voltage replication circuit is configured to maintain a voltage difference less than approximately 0.05 volts between the selected one and the non-selected one of the set of bitlines.

3. The semiconductor memory of claim 1, wherein the set of two terminal memory devices comprises a resistive random access memory, a phase-change random access memory, magnetoresistive random access memory, or a ferroelectric random access memory.

4. The semiconductor memory of claim 2, wherein the bias voltage replication circuit is configured to mitigate effects of inter-bitline current flow at the selected one of the set of bitlines in maintaining the voltage difference less than approximately 0.05 volts.

5. The semiconductor memory of claim 1, wherein:
 the set of bitline interconnects comprises bitlines of a block of the semiconductor memory; and
 the bias voltage replication circuit applies the observed voltage that is dynamically tracked to a nonselected subset of the bitlines of the block of the semiconductor memory that are not selected for a memory operation.

6. The semiconductor memory of claim 1, the bias voltage replication circuit comprises an operational amplifier that outputs the observed voltage that is dynamically tracked to the non-selected one of the set of bitlines.

7. The semiconductor memory of claim 6, wherein the observed voltage is an input to the operational amplifier.

8. The semiconductor memory of claim 7, wherein the observed voltage that is tracked is output by the operational amplifier is fed back as a second input to the operational amplifier, the input and the second input configured to drive the dynamically tracked observed voltage output to the observed voltage that is dynamically tracked.

9. The semiconductor memory of claim 1, wherein the set of two terminal memory devices and the set of bitline interconnects in part form a block of memory that is one of a set of memory blocks of the semiconductor memory.

10. The semiconductor memory of claim 9, further comprising a set of input/output signal connections.

11. The semiconductor memory of claim 10, wherein a first of the input/output signal connections is electrically coupled to the set of bitline interconnects associated with one of the set of memory blocks.

12. The semiconductor memory of claim 1, further comprising a sense amplifier configured to:
   apply the bias voltage to the selected one of the set of bitline interconnects to activate the selected one of the set of bitline interconnects for a read operation; and
   measure an electrical characteristic of an input/output connection associated with the selected one of the set of bitline interconnects to determine a state of an activated one of the set of two terminal memory devices that is connected to the selected one of the set of bitline interconnects.

13. A method of fabricating a semiconductor memory, comprising:
   forming a plurality of bitlines and a plurality of wordlines onto the semiconductor memory;
   forming an array of two-terminal memory elements in which columns and rows of the array are aligned with respect to the plurality of bitlines and the plurality of wordlines;
   connecting respective first contacts of two-terminal memory elements in a column of the array to one of the plurality of bitlines and respective second contacts of the two-terminal memory elements in the column to respective ones of the plurality of wordlines;
   forming a multiplexer circuit in the semiconductor memory configured for selectively applying an operation signal at least to a first subset of the plurality of bitlines; and
   forming an equalization circuit for driving a second subset of the plurality of bitlines with an operation voltage observed at the first subset of the plurality of bitlines in response to the operation signal.

14. The method of claim 13, further comprising forming a set of input/output contacts and forming an inter-connect matrix, wherein the inter-connect matrix selectively couples or decouples respective ones of the plurality of bitlines to a matching one of the set of input/output contacts.

15. The method of claim 14, further comprising forming a sensing circuit in the semiconductor memory and connecting the sensing circuit to one or more of the set of input/output contacts for measuring a state of a selected subset of the two-terminal memory elements of the array of two-terminal memory elements.

16. The method of claim 13, wherein forming the equalization circuit further comprises forming an operational amplifier and further wherein forming the multiplexer circuit comprises forming a bitline output lead that conveys the operation voltage as an input to the operational amplifier.

17. The method of claim 16, further comprising forming a feedback loop that provides an output of the operational amplifier as a second input to the operational amplifier.

18. The method of claim 13, further comprising forming respective sets of switches for respective ones of the set of bitlines for selectively applying the operation signal or the operation voltage to one or more of the set of bitlines.

19. A method of operating electronic memory, comprising:
   selecting a wordline of the electronic memory;
   applying a read voltage to a bitline of the electronic memory that is coupled to a two terminal memory element selected for reading;
   coupling the bitline to a circuit that dynamically mimics an actual voltage at the bitline of the electronic memory; and
   driving at least one additional bitline adjacent to the bitline with the actual voltage in conjunction with reading a state of the two terminal memory element.

20. The method of claim 19, wherein reading the state of the two terminal memory element further comprises:
   activating an input/output contact that is coupled to a set of bitlines of the electronic memory, the set of bitlines comprising bitlines connected with a block of the two terminal memory elements and including the bitline and the one additional bitline;
   coupling a sensing amplifier to an output of the bitline; and
   activating a reference signal and comparing a response of the RRAM element to the reference signal and determining whether the response is greater than or less than the reference signal.

* * * * *